United States Patent
Lim et al.

(10) Patent No.: US 9,515,186 B2
(45) Date of Patent: Dec. 6, 2016

(54) SEMICONDUCTOR DEVICE AND METHOD OF FABRICATING THE SAME

(71) Applicant: Samsung Electronics Co., Ltd., Suwon-si, Gyeonggi-do (KR)

(72) Inventors: Ha-Jin Lim, Seoul (KR); Hyeong-Joon Kim, Seoul (KR); Nae-In Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/602,660

(22) Filed: Jan. 22, 2015

(65) Prior Publication Data

US 2015/0206974 A1 Jul. 23, 2015

Related U.S. Application Data

(60) Provisional application No. 61/930,656, filed on Jan. 23, 2014.

(30) Foreign Application Priority Data

Nov. 7, 2014 (KR) ........................ 10-2014-0154660

(51) Int. Cl.
*H01L 29/76* (2006.01)
*H01L 29/78* (2006.01)
*H01L 21/8238* (2006.01)
*H01L 29/66* (2006.01)
*H01L 27/092* (2006.01)

(52) U.S. Cl.
CPC ... *H01L 29/7851* (2013.01); *H01L 21/823821* (2013.01); *H01L 27/0924* (2013.01); *H01L 29/66545* (2013.01); *H01L 29/66795* (2013.01); *H01L 29/7848* (2013.01)

(58) Field of Classification Search
CPC ........... H01L 21/8252; H01L 29/7783; H01L 33/0062
See application file for complete search history.

(56) References Cited

U.S. PATENT DOCUMENTS

| | | | | |
|---|---|---|---|---|
| 4,075,651 A | * | 2/1978 | James | ................. H01L 29/0692 148/DIG. 119 |
| 5,958,519 A | | 9/1999 | Wang et al. | |
| 6,355,951 B1 | * | 3/2002 | Hattori | ............. H01L 21/28587 257/192 |
| 6,818,928 B2 | * | 11/2004 | Hoke | ................ H01L 21/02395 257/190 |
| 7,494,940 B2 | | 2/2009 | Doh et al. | |
| 7,888,217 B2 | | 2/2011 | Chua et al. | |
| 2008/0203430 A1 | * | 8/2008 | Simin | ................ H01L 29/7783 257/192 |
| 2012/0074386 A1 | | 3/2012 | Rachmady et al. | |

(Continued)

FOREIGN PATENT DOCUMENTS

| | | |
|---|---|---|
| JP | 2011103318 | 5/2011 |
| KR | 100402951 | 10/2003 |
| KR | 101160450 | 6/2012 |

*Primary Examiner* — Cuong Q Nguyen
*Assistant Examiner* — Nishath Yasmeen
(74) *Attorney, Agent, or Firm* — Onello & Mello, LLP

(57) ABSTRACT

A semiconductor device includes a semiconductor substrate including a group III element and a group V element, and a gate structure on the semiconductor substrate. The semiconductor substrate includes a first region which contacts a bottom surface of the gate 5 structure and a second region which is disposed under the first region. The concentration of the group III element in the first region is lower than that of the group V element in the first region, and the concentration of the group III element in the second region is substantially equal to that of the group V element in the second region.

18 Claims, 38 Drawing Sheets

(56) References Cited

U.S. PATENT DOCUMENTS

| | | |
|---|---|---|
| 2012/0280372 A1 | 11/2012 | Umezawa et al. |
| 2012/0326212 A1 | 12/2012 | Fompeyrine et al. |
| 2013/0052813 A1 | 2/2013 | Yeh et al. |
| 2013/0126985 A1 | 5/2013 | Cheng et al. |
| 2013/0168735 A1 | 7/2013 | Fukuhara |

* cited by examiner

SEMICONDUCTOR DEVICE AND METHOD OF FABRICATING THE SAME

This U.S. non-provisional application claims priority from U.S. Provisional Patent Application Ser. No. 61/930,656, filed on Jan. 23, 2014 and from Korean Patent Application No. 10-2014-0154660, filed on Nov. 7, 2014 in the Korean Intellectual Property Office, the contents of which are herein incorporated by reference in their entirety.

BACKGROUND

1. Field

The present inventive concepts relate to a semiconductor device and a method of fabricating the same.

2. Description of the Related Art

Research has been conducted on technology that may form a channel of a transistor using a group III-V compound in order to improve the mobility of carriers.

However, if a gate insulating layer having a high dielectric constant (high-K) is formed directly on the group III-V compound, an unstable interface may be formed. Therefore, when in operation, the transistor may have a high density of interface trap charge (DIT), which degrades the performance of the transistor.

SUMMARY

Some embodiments of the present inventive concepts provide a semiconductor device with improved product reliability.

Some embodiments of the present inventive concepts also provide a method of fabricating a semiconductor device with improved product reliability.

According to an aspect of the present inventive concepts, there is provided a semiconductor device. The semiconductor device includes a semiconductor substrate comprising a group III element and a group V element, and a gate structure on the semiconductor substrate. The semiconductor substrate includes a first region which contacts a bottom surface of the gate structure and a second region disposed under the first region. The concentration of the group III element in the first region is lower than that of the group V element in the first region, and the concentration of the group III element in the second region is substantially equal to that of the group V element in the second region.

In some embodiments, the group III element is at least one of Ga, In and Al, and the group V element is at least one of P, As and Sb.

In some embodiments, the concentration of the group III element in the first region increases from a top surface of the first region toward a bottom surface of the first region.

In some embodiments, the concentration of the group III element at the top surface of the first region is 10% or less.

In some embodiments, the top surface of the first region comprises 5% or less of oxygen atoms.

In some embodiments, the first region has a thickness of 1 to 20 nm.

In some embodiments, the gate structure comprises a gate insulating layer contacting the first region and a gate electrode disposed on the gate insulating layer.

In some embodiments, the gate insulating layer is concave-shaped, and the gate electrode is disposed on the gate insulating layer.

In some embodiments, the semiconductor device further includes source/drain regions disposed in the semiconductor substrate on one or more sides of the first and second regions.

In some embodiments, the first region is spaced apart from the source/drain regions.

In some embodiments, the semiconductor device further includes a substrate disposed under the semiconductor substrate.

In some embodiments, the substrate does not comprise the group III element and the group V element.

According to another aspect of the present inventive concepts, there is provided a semiconductor device. The semiconductor device includes a substrate, a fin protruding upward from the substrate in a first direction, and comprising a first material and a second material; and a gate structure on the fin intersecting with the fin. The fin comprises a channel region disposed under the gate structure, and the concentration of the first material in the channel region increases from a surface of the channel region toward the inside of the channel region.

In dome embodiments, the first material comprises a group III element, and the second material comprises a group V element.

In some embodiments, the concentration of the second material in the channel region decreases from the surface of the channel region toward the interior of the channel region.

In some embodiments, a difference between the concentration of the first material and the concentration of the second material is reduced from the surface of the channel region toward the interior of the channel region.

In some embodiments, the concentration of the second material is higher than that of the first material at the surface of the channel region.

In some embodiments, the concentration of the first material at the surface of the channel region is 10% or less.

In some embodiments, the gate structure comprises a gate insulating layer contacting the channel region and a gate electrode disposed on the gate insulating layer.

In some embodiments, the semiconductor device further includes a capping layer covering the gate electrode.

In some embodiments, the semiconductor device further includes source/drain regions formed in the fin on one or more sides of the gate structure, wherein the concentration of the first material is substantially equal to that of the second material at a surface of the fin which contacts the source/drain regions.

According to another aspect of the present inventive concepts, there is provided a method of fabricating a semiconductor device. The method includes providing a semiconductor substrate comprising a group III element and a group V element, forming an oxide layer by oxidizing a top surface of the semiconductor substrate, removing the oxide layer, and forming a gate structure on the semiconductor substrate.

In some embodiments, the group III element is at least one of Ga, In and Al, and the group V element is at least one of P, As and Sb.

In some embodiments, the method further includes removing a natural oxide layer by cleaning the top surface of the semiconductor substrate before the forming of the oxide layer.

In some embodiments, the oxide layer comprises more oxides of the group III element than oxides of the group V element.

In some embodiments, the oxidizing the top surface of the semiconductor substrate comprises oxidizing the top surface of the semiconductor substrate for 30 minutes to 2 hours at 5 atm or higher and at 300° C. or higher.

In some embodiments, the oxidizing the top surface of the semiconductor substrate comprises oxidizing the top surface of the semiconductor substrate for 30 minutes to 2 hours at a high temperature of 600° C. or higher.

In some embodiments, the concentration of the group V element is higher than that of the group III element at the top surface of the semiconductor substrate after the removing of the oxide layer.

In some embodiments, the forming of the gate structure further comprises forming a gate insulating layer contacting the semiconductor substrate and forming a gate electrode on the gate insulating layer.

In some embodiments, the removing of the oxide layer comprises removing the oxide layer using wet etching.

In some embodiments, the method further includes forming source/drain regions in the semiconductor substrate before the forming of the oxide layer, wherein the forming of the oxide layer comprises forming the oxide layer by oxidizing the top surface of the semiconductor substrate between the source/drain regions.

According to another aspect of the present inventive concepts, there is provided a method of fabricating a semiconductor device. The method includes forming a fin which protrudes upward from a substrate and comprises a first material and a second material in substantially equal concentrations, cleaning a channel region of the fin; forming an oxide layer by oxidizing the channel region of the fin, exposing the channel region by removing the oxide layer; and forming a gate structure to cover the channel region. The oxide layer oxidizes the first material of the fin more than the second material of the fin, and the concentration of the second material is higher than that of the first material at a surface of the channel region.

In some embodiments, the first material comprises a group III element, and the second material comprises a group V element.

In some embodiments, the oxidizing the channel region is performed for 30 minutes to 2 hours at 5 atm or higher and at 300° C. or higher.

In some embodiments, the method further includes, after the forming of the fin: forming a dummy gate structure intersecting with the fin and covering the channel region; forming source/drain regions on one or more sides of the dummy gate structure; and exposing the channel region of the fin by removing the dummy gate structure.

In some embodiments, the forming the gate structure comprises forming a gate insulating layer contacting the surface of the channel region and forming a gate electrode on the gate insulating layer.

According to another aspect of the present inventive concepts, there is provided a semiconductor device. The semiconductor device includes a semiconductor substrate comprising a group III element and a group V element, and a gate structure on the semiconductor substrate. The semiconductor substrate includes a first region contacting a bottom surface of the gate structure, and a second region disposed under the first region. The concentration of the group V element is higher than the concentration of the group III element at the surface of the semiconductor substrate.

In some embodiments, the concentration of the group III element in the first region increases from a top surface of the first region toward a bottom surface of the first region.

In some embodiments, the concentration of the group III element in the second region is substantially equal to that of the group V element in the second region.

In some embodiments, the concentration of the group III element in the first region is lower than that of the group V element in the first region.

In some embodiment, the group III element is at least one of Ga, In and Al, and the group V element is at least one of P, As and Sb.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts.

FIGS. 35 through 39 and 55 are perspective views illustrating steps of a method of fabricating the semiconductor device of FIG. 6 according to an example embodiment of the present inventive concepts.

DETAILED DESCRIPTION OF THE EMBODIMENTS

Figure 1:
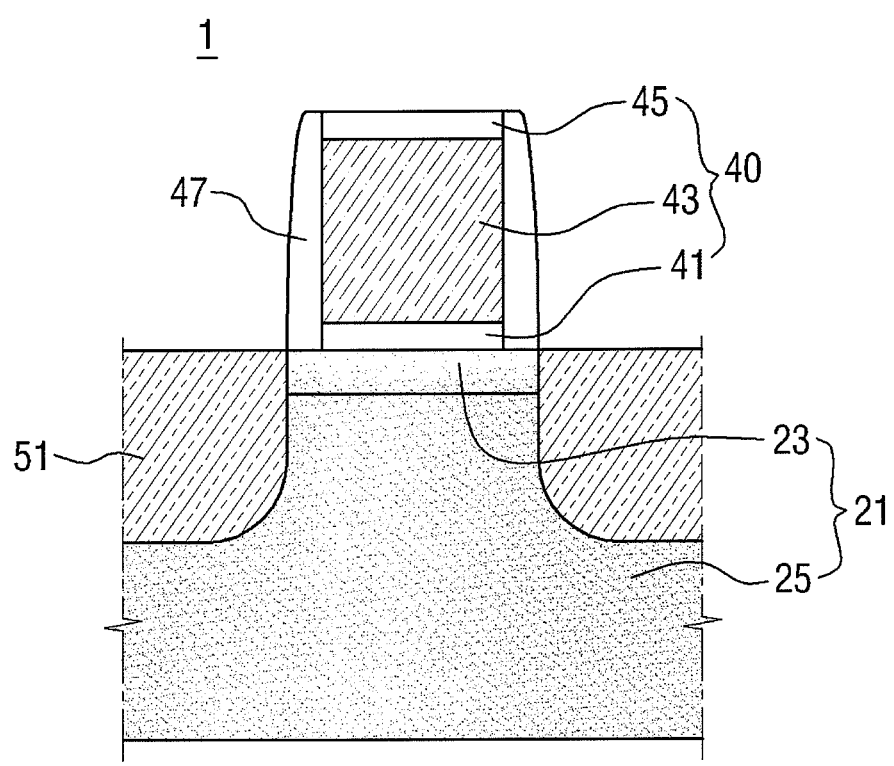
FIG. 1 is a cross-sectional view of a semiconductor device according to an example embodiment of the present inventive concepts.

Various example embodiments will be described more fully hereinafter with reference to the accompanying drawings, in which some example embodiments are shown. The present inventive concepts may, however, be embodied in many different forms and should not be construed as being limited to the embodiments set forth herein.

The terminology used herein is for the purpose of describing particular example embodiments only and is not intended to be limiting of the present inventive concepts. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element or layer is referred to as being "directly on", "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present inventive concepts.

Spatially relative terms, such as "beneath", "below", "lower", "above", "upper", and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Example embodiments are described herein with reference to cross-section illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concepts.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern A semiconductor device according to an example embodiment of the present inventive concepts will now be described with reference to FIGS. 1 and 25.

Figure 25:
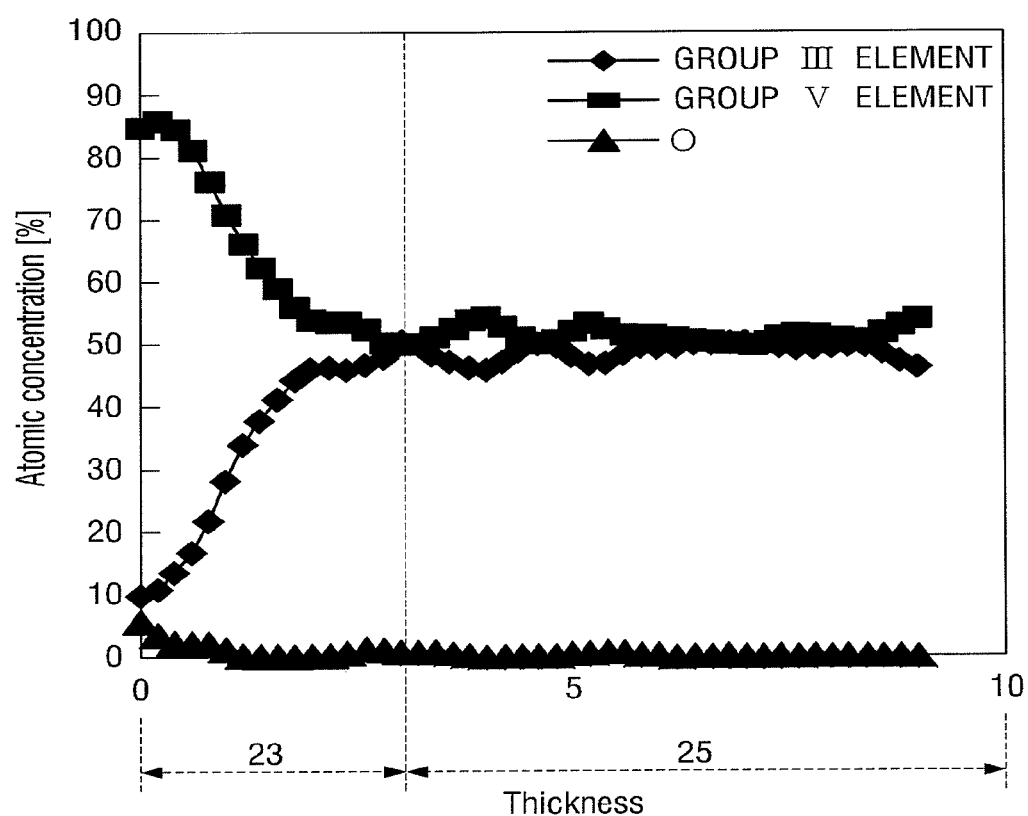
FIG. 25 is a graph illustrating the concentrations of first and second materials in a first region and a second region of a semiconductor substrate according to an example embodiment of the present inventive concepts.

FIG. 1 is a cross-sectional view of a semiconductor device 1 according to an example embodiment of the present inventive concepts. FIG. 25 is a graph illustrating the concentrations of first and second materials in a first region 23 and a second region 25 of a semiconductor substrate 21.

Referring to FIG. 1, the semiconductor device 1 may include the semiconductor substrate 21, a gate structure 40, and source/drain regions 51.

The semiconductor substrate 21 may include the first material and the second material. The first material may be, for example, a group III element, and the second material may be, for example, a group V element. The group III element may be, for example, at least one of Ga, In, and Al. The group V element may be, for example, at least one of P, As, and Sb. Therefore, the semiconductor substrate 21 may be made of, for example, at least one of GaAs, InGaAs, AlGaAs, InAs, GaSb, InSb, and InP.

The concentrations of the first material and the second material included in the semiconductor substrate 21 may vary according to a location within the semiconductor substrate 21. The concentration of the second material at the top surface of the semiconductor substrate 21 is greater than the concentration of the first material at the top surface of the semiconductor substrate 21. As the depth from a top surface of the semiconductor substrate 21 increases, the concentration of the first material may increase and the concentration of the second material may decrease. The concentration of the first material may be substantially equal to the concentration of the second material at a specific depth from the top surface of the semiconductor substrate 21.

Specifically, the semiconductor substrate 21 includes the first region 23 and the second region 25. The first region 23 may be located at the top surface of the semiconductor substrate 21, and the second region 25 may be disposed under the first region 23. The first region 21 contacts the gate structure 40. The first region 21 may have a thickness of, for example, 1 to 20 nm.

Referring to FIG. 25, the concentration of the first material in the first region 23 increases gradually from a top surface of the first region 23 toward a bottom surface of the first region 23. That is, the concentration of the first material at the top surface of the first region 23 is less than the concentration of the first material at the bottom surface of the first region 23. The concentration of the first material at the top surface of the first region 23 is 10% or less. In the first region 23, the concentration of the first material is lower than that of the second material.

In the first region 23, the concentration of the second material is higher than that of the first material. That is, the concentration of the second material is higher than the first material at the top surface of the first region 23 and at the bottom surface of the first region 23. However, the concentration of the second material decreases toward the bottom surface of the first region 23, and a difference between the concentration of the second material and the concentration of the first material is reduced toward the bottom surface of the first region 23.

The first region 23 may include some oxygen atoms. The oxygen atoms may be reduced from the top surface of the first region 23 toward the bottom surface of the first region 23 and may no longer exist at a specific depth from the top surface of the first region 23. That is, the oxygen atoms at the top surface of the first region 23 are greater than the oxygen atoms at the bottom surface of the first region 23. The concentration of oxygen atoms may be 5% or less at the top surface of the first region 23.

In the second region 25, the concentration of the first material may be substantially equal to that of the second material. Here, the term "substantially" denotes not only exactly the same, but also permits for a margin of error that may occur during a process. Therefore, as illustrated in FIG. 25, the concentration of the first material and the concentration of the second material may not be equal in some parts of the second region 25.

In the second region 25, the oxygen atoms may hardly exist as illustrated in FIG. 25.

Referring back to FIG. 1, the gate structure 40 may be disposed on the semiconductor substrate 21. The gate structure 40 may be disposed on the first region 23 of the semiconductor substrate 21. The gate structure 40 may include a gate insulating layer 41, a gate electrode 43, and a hard mask layer 45.

The gate insulating layer 41 may be disposed on the semiconductor substrate 21. The gate insulating layer 41 may contact the semiconductor substrate 21. The gate insulating layer 41 may contact the first region 23 of the semiconductor substrate 21. The gate insulating layer 41 may include a material selected from the group consisting of, for example, HfSiON, $HfO_2$, $ZrO_2$, $Al_2O_3$, $Ta_2O_5$, $TiO_2$, $SrTiO_3$, and $(Ba,Sr)TiO_3$. Alternatively, the gate insulating layer 41 may be a silicon oxide layer.

The gate electrode 43 may be disposed on the gate insulating layer 41. The gate electrode 43 may include a conductive material, for example, polysilicon.

The hard mask layer 45 may be disposed on the gate electrode 43. The hard mask layer 45 may include, for example, at least one of an oxide layer, a nitride layer, and an oxynitride layer.

The source/drain regions 51 may be disposed on one or more sides of the gate structure 40. The source/drain regions 51 may be formed in the semiconductor substrate 21. The source/drain regions 51 may be formed in the semiconductor substrate 21 adjacent to the first region 23 and the second region 25.

If the semiconductor device 1 is a P-channel metal-oxide-semiconductor (PMOS) transistor, the source/drain regions 51 may include a material having a greater lattice constant than the semiconductor substrate 21. Alternatively, if the semiconductor device 1 is an N-channel metal-oxide-semiconductor (NMOS) transistor, the source/drain regions 51 may include a material having a smaller lattice constant than the semiconductor substrate 21.

Spacers 47 may be disposed on one or more sides of the gate structure 40. The spacers 47 may cover one or more sidewalls of the gate structure 40. Each of the spacers 47 may be, for example, at least one of a silicon oxide layer, a silicon nitride layer, and a silicon oxynitride layer.

The spacers 47 may be formed on the first region 23.

A semiconductor device 2 according to an example embodiment of the present inventive concepts will now be described with reference to FIG. 2. For simplicity, a description of elements substantially identical to those of the previous embodiment of FIG. 1 will be omitted, and the current embodiment of FIG. 2 will hereinafter be described, focusing mainly on differences with the pervious embodiment of FIG. 1.

Figure 2:
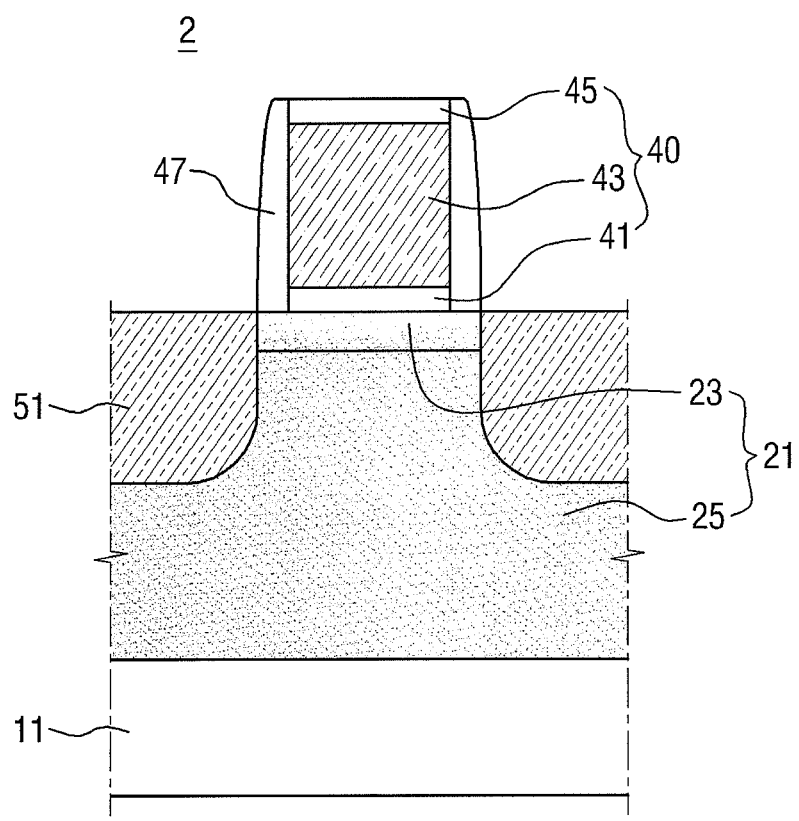
FIG. 2 is a cross-sectional view of a semiconductor device according to an example embodiment of the present inventive concepts.

FIG. 2 is a cross-sectional view of the semiconductor device 2 according to an example embodiment of the present inventive concepts.

The semiconductor device 2 of FIG. 2 may be the same as the semiconductor device 1 of FIG. 1 in terms of a semiconductor substrate 21, a gate structure 40, and source/drain regions 51. Therefore, the semiconductor substrate 21 of the semiconductor device 2, like the semiconductor device 1, includes a first region 23 and a second region 25. In the semiconductor device 2, the semiconductor substrate 21 includes a first material, for example, a group III element and a second material, for example, a group V element. The concentration of the first material increases from a top surface of the first region 23 toward a bottom surface of the first region 23. That is, the concentration of the first material at the top surface of the first region 23 is less than the concentration of the first material at the bottom surface of the first region 23. In the first region 23 of the semiconductor device 2, the concentration of the first material is lower than that of the second material. In the second region 25 of the semiconductor device 2, the concentration of the first material is substantially equal to that of the second material.

The semiconductor device 2 of FIG. 2 may include a substrate 11 in addition to the elements of the semiconductor device 1 of FIG. 1. The substrate 11 may be disposed under the semiconductor substrate 21. The substrate 11 may be made of, for example, one or more semiconductor materials selected from the group consisting of Si, Ge, SiGe, SiC, and SiGeC. The substrate 11 may also be, for example, a silicon-on-insulator (SOI) substrate. That is, the substrate 11 may not include a group III element and a group V element.

A semiconductor device according to an example embodiment of the present inventive concepts will now be described with reference to FIGS. 3 and 25.

Figure 3:
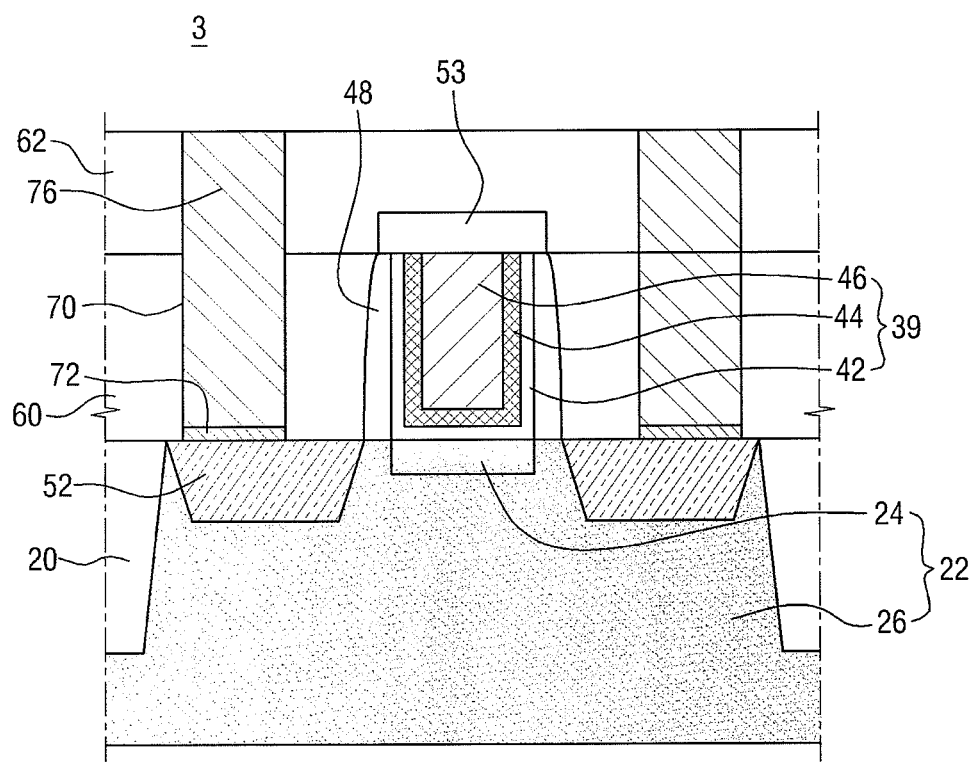
FIG. 3 is a cross-sectional view of a semiconductor device according to an example embodiment of the present inventive concepts.

FIG. 3 is a cross-sectional view of a semiconductor device 3 according to an example embodiment of the present inventive concepts.

Referring to FIG. 3, the semiconductor device 3 may include a semiconductor substrate 22, a gate structure 39, source/drain regions 52, and contacts 76.

The semiconductor substrate 22 may include a first material and a second material. The first material may be, for example, a group III element, and the second material may be, for example, a group V element. The group III element may be, for example, at least one of Ga, In, and Al. The group V element may be, for example, at least one of P, As, and Sb. Therefore, the semiconductor substrate 22 may be made of, for example, at least one of GaAs, InGaAs, AlGaAs, InAs, GaSb, InSb, and InP.

The concentrations of the first material and the second material included in the semiconductor substrate 22 may vary according to a location within the semiconductor substrate 22. The concentration of the second material at the top surface of the semiconductor substrate 22 is greater than the concentration of the first material at the top surface of the semiconductor substrate 22. As the depth from a top surface of the semiconductor substrate 22 increases, the concentration of the first material may increase and the concentration of the second material may decrease. The concentration of the first material may be substantially equal to the concentration of the second material at a specific depth from the top surface of the semiconductor substrate 22.

Specifically, the semiconductor substrate 22 includes a first region 24 and a second region 26. The first region 24 is located at the top surface of the semiconductor substrate 22, and the second region 26 is disposed under the first region 24. The first region 24 contacts the gate structure 39. The first region 24 may have a thickness of, for example, 1 to 20 nm.

The concentration of the first material and the concentration of the second material will now be described in detail with reference to FIG. 25. The first region 24 of FIG. 3 corresponds to reference numeral 23 of FIG. 25, and the second region 26 of FIG. 3 corresponds to reference numeral 25 of FIG. 25.

In the first region 24, the concentration of the first material increases gradually from a top surface of the first region 24 toward a bottom surface of the first region 24. That is, the concentration of the first material at the top surface of the first region 24 is less than the concentration of the first material at the bottom surface of the first region 24. The concentration of the first material at the top surface of the first region 24 is 10% or less. In the first region 24, the concentration of the first material is lower than that of the second material.

In the first region 24, the concentration of the second material is higher than that of the first material. That is, the concentration of the second material is higher than the first material at the top surface of the first region 23 and at the bottom surface of the first region 23. However, the concentration of the second material decreases toward the bottom surface of the first region 24, and a difference between the concentration of the second material and the concentration of the first material is reduced toward the bottom surface of the first region 24.

The first region 24 may include some oxygen atoms. The oxygen atoms may be reduced from the top surface of the first region 24 toward the bottom surface of the first region 24 and may no longer exist at a specific depth from the top surface of the first region 24. That is, the oxygen atoms at the top surface of the first region 24 are greater than the oxygen atoms at the bottom surface of the first region 24. The concentration of oxygen atoms may be 5% or less at the top surface of the first region 24.

In the second region 26, the concentration of the first material may be substantially equal to that of the second material. Here, the term "substantially" denotes not only exactly the same, but also permits for a margin of error that may occur during a process. Therefore, as illustrated in FIG. 25, the concentration of the first material and the concentration of the second material may not be equal in some parts of the second region 26.

In the second region 26, the oxygen atoms may hardly exist as illustrated in FIG. 25.

Referring back to FIG. 3, device isolation layers 20, for example, shallow trench isolation (STI) layers, are formed in the semiconductor substrate 22 to define an active region.

The gate structure 39 may be disposed on the semiconductor substrate 22. That gate structure 39 may be disposed on the first region 24 of the semiconductor substrate 22. The gate structure 39 may include a gate insulating layer 42, a work function control layer 44, and a gate metal 46.

The gate insulating layer 43 may be disposed on the semiconductor substrate 22. The gate insulating layer 42 may be formed to contact the first region 24 of the semiconductor substrate 22. The gate insulating layer 42 may be formed conformally along the top surface of the first region 24 and along sidewalls of spacers 48. Therefore, the gate insulating layer 42 may have a concave shape.

The gate insulating layer 42 may include a high-k material. The gate insulating layer 42 may include a material selected from the group consisting of, for example, HfSiON, $HfO_2$, $ZrO_2$, $Al_2O_3$, $Ta_2O_5$, $TiO_2$, $SrTiO_3$, and $(Ba,Sr)TiO_3$. The gate insulating layer 42 may be formed to an appropriate thickness according to the type of device to be formed.

A gate electrode may include the work function control layer 44 and the gate metal 46. The gate electrode including the work function control layer 44 and the gate metal 46 may be disposed on the gate insulating layer 42. The gate electrode including the work function control layer 44 and the gate metal 46 may fill a space inside the concave region formed by the gate insulating layer 42.

The work function control layer 44 may be disposed on the gate insulating layer 42. The work function control layer 44 may be formed directly on the gate insulating layer 42. Specifically, the work function control layer 44 may be formed conformally along the top surface of the first region 24 and the sidewalls of the spacers 48 with the gate insulating layer 42 therebetween, and may have a concave shape.

If the semiconductor device 3 is an NMOS transistor, the work function control layer 44 may be an N-type work function control layer and may include at least one of, for example, TiAl, TiAlC, TiAlN, TaC, TiC, and HfSi.

Alternatively, if the semiconductor device 3 is a PMOS transistor, the work function control layer 44 may be a P-type work function control layer and may include, for example, TiN. Alternatively, the work function control layer 44 may have a structure composed of a P-type work function control layer and an N-type work function control layer stacked on the P-type work function control layer. In such an embodiment, the work function control layer 44 may perform the same function as the P-type work function control layer.

The gate metal 46 may fill the concave region formed by the gate insulating layer 42 and the work function control layer 44.

The spacers 48 may be disposed on one or more sides of the gate structure 39. The spacers 48 may cover one or more sidewalls of the gate structure 39. The spacers 48 may be disposed on the second region 26 but not on the first region 24. That is, the spacers may be disposed on the second region 26 between the first region 24 and the source/drain regions 52.

Each of the spacers 48 may be, for example, at least one of a nitride layer and an oxynitride layer. In an alternative embodiment to FIG. 3, each of the spacers 48 may be a multilayer, rather than a single layer as illustrated in FIG. 3.

The source/drain regions 52 may be disposed on one or more sides of the gate structure 39. The source/drain regions 52 may be formed in the semiconductor substrate 22 by an epitaxial process.

The source/drain regions 52 may be spaced apart from the first region 24 by the second region 26. That is, the source/drain regions 52 may be formed such that the source/drain regions 52 do not contact the first region 24. Therefore, the source/drain regions 52 contact the second region 26. The concentration of the first material and the concentration of the second material may be substantially equal at a surface of the semiconductor substrate 22 which contacts the source/drain regions 52. That is, the concentration of the first material and the concentration of the second material may be substantially equal at a surface of the second region 26 which contacts the source/drain regions 52.

If the semiconductor device 3 is a PMOS transistor, the source/drain regions 52 may include a material having a greater lattice constant than the semiconductor substrate 22. Alternatively, if the semiconductor device 3 is an NMOS transistor, the source/drain regions 52 may include a material having a smaller lattice constant than the semiconductor substrate 22.

A capping layer 53 may be disposed on the gate structure 39. The capping layer 53 may cover the gate structure 39 such that the gate insulating layer 42, the work function control layer 44, and the gate metal 46 are not exposed. In addition, the capping layer 53 may be disposed on top surfaces of spacers 48.

The capping layer 53 may be, for example, a nitride layer, for example, at least one of SiN, SiON and SiCON, or an oxide layer.

A first interlayer insulating film 60 may be disposed to cover the semiconductor substrate 22 and sidewalls of the spacers 48. In addition, the first interlayer insulating film 60 may partially cover sidewalls of the contact holes 70 such that upper sidewalls of the contact holes 70 are not covered by the first interlayer insulating film 60. A top surface of the first interlayer insulating film 60 and a top surface of the gate structure 39 may lie in the same plane. That is a top surface of the first interlayer insulating film 60 may be substantially level with the top surface of the gate structure 39. The top surface of the first interlayer insulating film 60 and the top surface of the gate structure 39 may be made to lie in the same plane by a planarization process, for example, a chemical mechanical polishing (CMP) process.

A second interlayer insulating film 62 may be disposed on the first interlayer insulating film 60. The second interlayer insulating film 62 may cover the gate structure 39 and the capping layer 53 and the remaining part of the sidewalls of the contact holes 70.

The first and second interlayer insulating layers 60 and 62 may include, for example, at least one of an oxide layer, a nitride layer, and an oxynitride layer.

The contact holes 70 may be disposed on the source/drain regions 52, respectively. The contact holes 70 may penetrate through the first and second interlayer insulating layers 60 and 62 and expose top surfaces of the source/drain regions 52, respectively.

Contact metal layers 72 may be formed in the contact holes 70, respectively, along bottom surfaces thereof. The contact metal layers 72 may contact the source/drain regions 52, respectively.

The contact metal layers 72 may reduce the surface resistance, contact resistance, or the like, of the source/drain regions 52. The contact metal layers 72 may include a conductive material, for example, Pt, Ni, Co, Au, or Al.

Contacts 76 may be disposed on the contact metal layers 72 to fill the contact holes 70, respectively. The contacts 76 may be made of a conductive material, for example, W, Al or Cu. However, the present inventive concepts are not limited thereto.

As illustrated in FIG. 3, each of the contacts 76 may have a uniform thickness from the bottom toward the top thereof. However, the present inventive concepts are not limited thereto. For example, each of the contacts 76 may also become wider from the bottom toward the top thereof.

A semiconductor device 4 according to an example embodiment of the present inventive concepts will now be described with reference to FIG. 4. For simplicity, a description of elements substantially identical to those of the previous embodiments will be omitted, and the current embodiment will hereinafter be described, focusing mainly on differences with the pervious embodiments.

Figure 4:
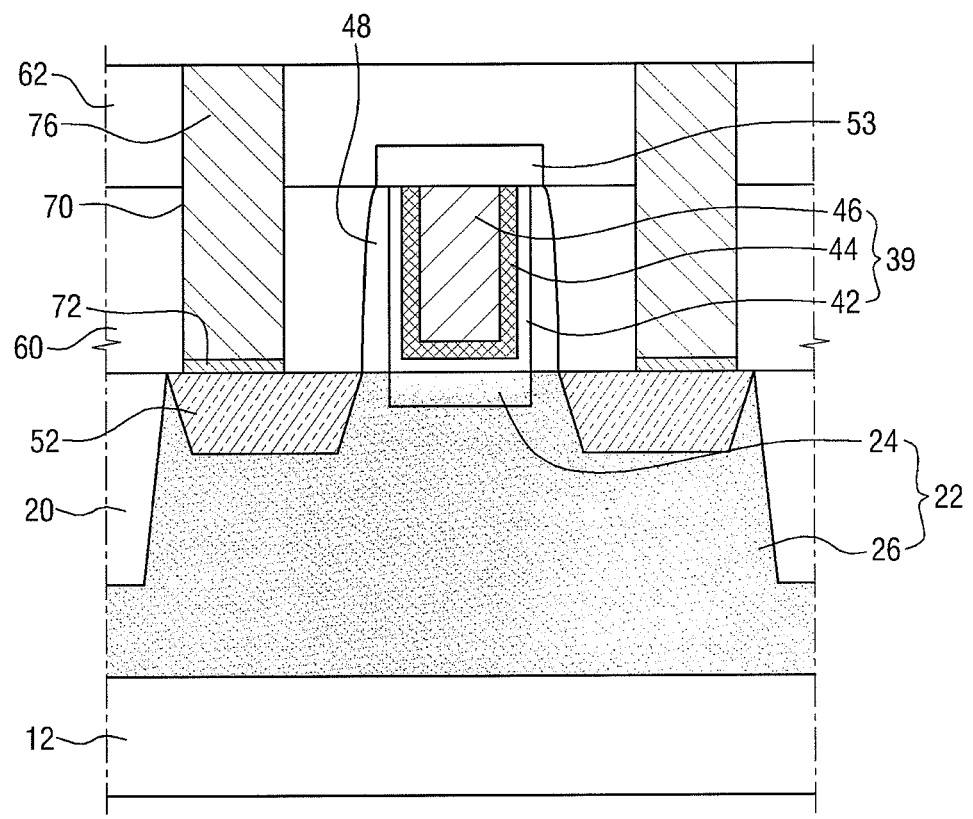
FIG. 4 is a cross-sectional view of a semiconductor device according to an example embodiment of the present inventive concepts.

FIG. 4 is a cross-sectional view of the semiconductor device 4 according to an example embodiment of the present inventive concepts.

Referring to FIG. 4, the semiconductor device 4 may include a substrate 12 in addition to the elements of the semiconductor device 3 of FIG. 3. The substrate 12 may be disposed under the semiconductor substrate 22. The substrate 12 may be made of, for example, one or more semiconductor materials selected from the group consisting of Si, Ge, SiGe, SiC, and SiGeC. The substrate 12 may also be, for example, an SOI substrate. That is, the substrate 12 may not include a group III element and a group V element.

A semiconductor device 5 according to an example embodiment of the present inventive concepts will now be described with reference to FIG. 5. For simplicity, a description of elements substantially identical to those of the previous embodiments will be omitted, and the current embodiment will hereinafter be described, focusing mainly on differences with the pervious embodiments.

Figure 5:
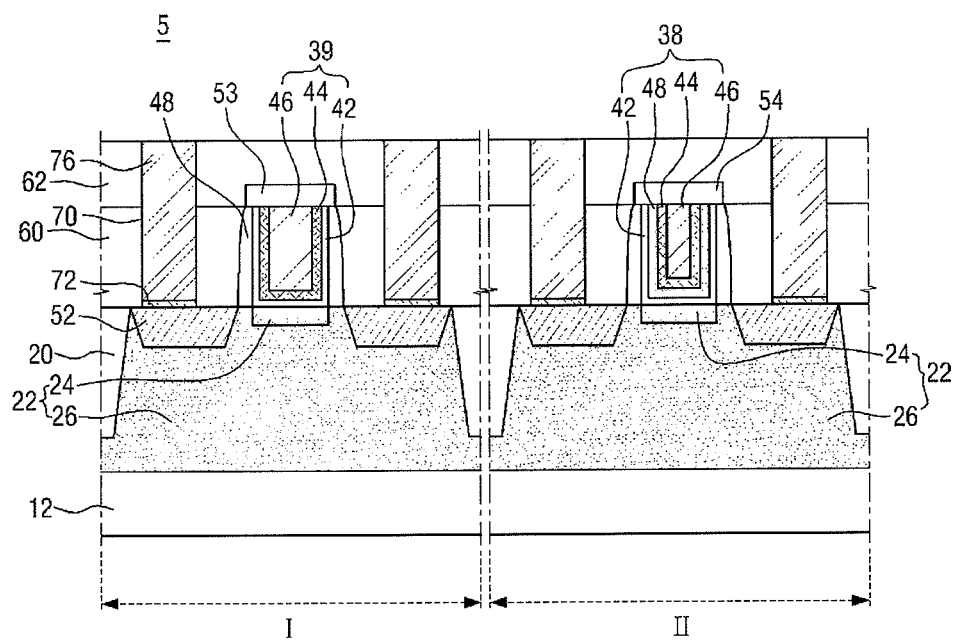
FIG. 5 is a cross-sectional view of a semiconductor device according to an example embodiment of the present inventive concepts.

FIG. 5 is a cross-sectional view of the semiconductor device 5 according to an example embodiment of the present inventive concepts.

Referring to FIG. 5, a substrate 12 may include an NMOS area I and a PMOS area II. The NMOS area I may be the same structure as the semiconductor device 4 of FIG. 4. A work function control layer 44 may include, for example, at least one of TiAl, TiAlC, TiAlN, TaC, TiC, and HfSi.

The PMOS area II may be the structure as the semiconductor device 4 of FIG. 4 except for a gate structure 38. The gate structure 38 in the PMOS area II may include two work function control layers 44, 48. A second work function control layer 44 may be stacked on a first work function control layer 48, and the first and second work function control layers 48 and 44 may be concave in shape. The first work function control layer 48 may be disposed between the second work function control layer 44 and the gate insulating layer 42. The gate metal 46 may be disposed in and fill the concave region formed by the gate insulating layer 42, the first work function control layer 48 and the second work function control layer 44. The first work function control layer 48 may be a P-type work function control layer, and the second work function control layer 44 may be an N-type work function control layer. Therefore, the second work function control layer 44 may include, for example, at least one of TiAl, TiAlC, TiAlN, TaC, TiC, and HfSi, and the first work function control layer 48 may include, for example TiN. The first work function control layer 48 may affect the operation of the gate structure 38 in the PMOS area II, and the N-type work function control layer 44 may affect the operation of the gate structure 39 in the NMOS area I.

A semiconductor device 6 according to an example embodiment of the present inventive concepts will now be described with reference to FIGS. 6 through 8.

Figure 6:
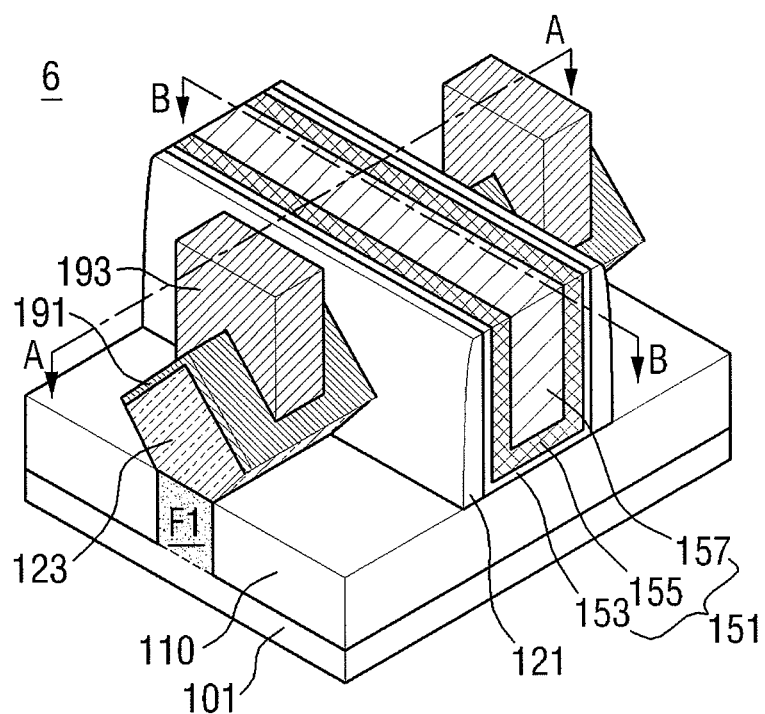
FIG. 6 is a perspective view of a semiconductor device according to an example embodiment of the present inventive concepts.
Figure 7:
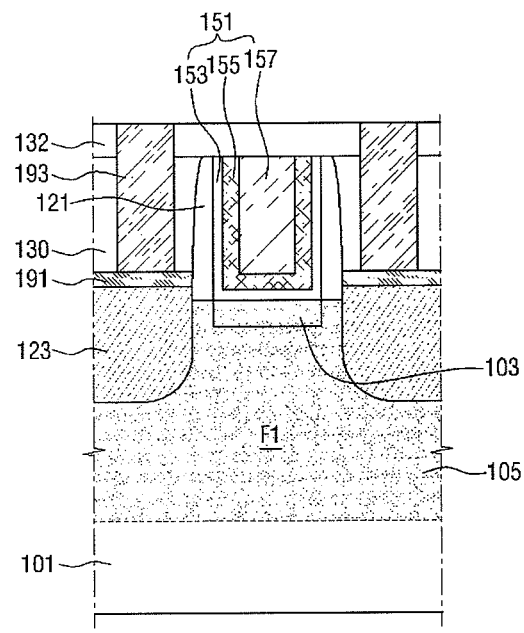
FIGS. 7 and 8 are cross-sectional views of the semiconductor device of FIG. 6 according to an example embodiment of the present inventive concepts.
Figure 8:
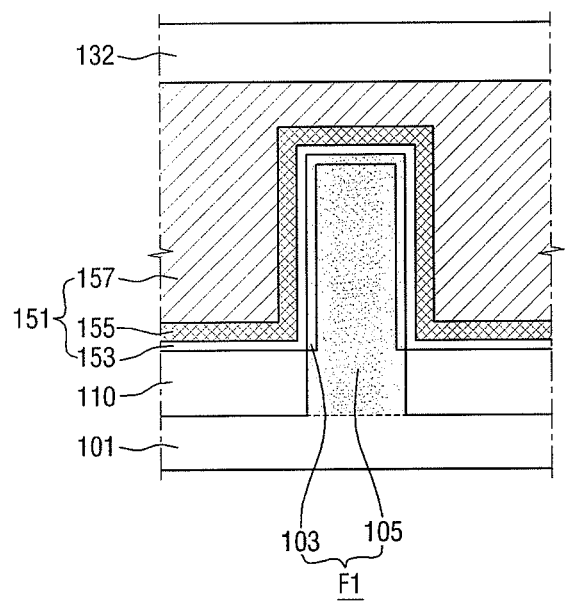

FIGS. 6 through 8 are views of the semiconductor device 6 according to an example embodiment of the present inventive concepts. Specifically, FIG. 6 is a perspective view of the semiconductor device 6 according to an example embodiment of the present inventive concepts. FIG. 7 is a cross-sectional view taken along the line A-A of FIG. 6. FIG. 8 is a cross-sectional view taken along the line B-B of FIG. 6. In FIG. 6, first and second interlayer insulating films 130 and 132 are not illustrated.

Referring to FIGS. 6 through 8, the semiconductor device 6 may include a substrate 101, a fin F1, a field insulating layer 110, a gate structure 151, spacers 121, source/drain regions 123, contact metal layers 191, contacts 193, the first interlayer insulating film 130, and the second interlayer insulating film 132.

Specifically, the substrate 101 may be made of, for example, one or more semiconductor materials selected from the group consisting of Si, Ge, SiGe, GaP, GaAs, SiC, SiGeC, InAs, and InP. The substrate 101 may also be, for example, an SOI substrate.

The fin F1 may extend along a lengthwise direction, that is, a second direction Y1. The fin F1 may have long sides and short sides. In FIG. 6, a long-side direction is the second direction Y1, and a short-side direction is a widthwise direction, that is, a first direction X1. However, the present inventive concepts are not limited thereto. For example, the long-side direction of the fin F1 may be the first direction X1, and the short-side direction of the fin F1 may be the second direction Y1. The fin F1 may protrude from the substrate 101 in a third direction Z1.

The fin F1 may be part of the substrate 101 and may include an epitaxial layer grown from the substrate 101.

The fin F1 may include a first material and a second material. The first material may be, for example, a group III element, and the second material may be, for example, a group V element. The group III element may be at least one of, for example, Ga, In, and Al. The group V element may be at least one of, for example, P, As, and Sb. Therefore, the fin F1 may be made of, for example, at least one of GaAs, InGaAs, AlGaAs, InAs, GaSb, InSb, and InP.

The fin F1 may include a channel region between the source/drain regions 123 and under the gate structure 151.

The concentrations of the first material and the second material included in the fin F1 may vary according to a location within the fin F1, specifically, the channel region. The concentration of the second material at the surface of the channel region of the fin F1 is greater than the concentration of the first material at the surface of the channel region of the fin F1. As a depth from a surface of the channel region of the fin F1 increases, the concentration of the first material may increase, and the concentration of the second material may decrease. The concentration of the first material may be substantially equal to the concentration of the second material at a specific depth from the top surface of the channel region of the fin F1.

Specifically, the channel region of the fin F1 includes a first region 103 and a second region 105. The first region 103 may be located at the surface of the channel region of the fin F1, and the second region 105 may disposed inside a convex region formed by the first region 103, as illustrated in FIG. 7, and under the first region 103, as illustrated in FIGS. 7 and 8. The first region 103 may contact the gate structure 151. The first region 103 may be disposed in a top surface and sidewalls of the fin F1. The first region 103 may have a thickness of, for example, 1 to 20 nm.

The concentration of the first material and the concentration of the second material will now be described in detail with reference to FIG. 25. The first region 103 of FIGS. 6 through 8 corresponds to reference numeral 23 of FIG. 25, and the second region 105 of FIGS. 6 through 8 corresponds to reference numeral 25 of FIG. 25.

In the first region 103, the concentration of the first material increases gradually from a top surface of the first region 103 toward a surface which contacts the second region 105. That is, the concentration of the first material at the top surface of the first region 103 is less than the concentration of the first material at the surface of the first region 103 which contacts the second region 105. The concentration of the first material at the top surface of the first region 103 is 10% or less. In the first region 103, the concentration of the first material is lower than that of the second material.

In the first region 103, the concentration of the second material is higher than that of the first material. That is, the concentration of the second material is higher than the first material at the top surface of the first region 103 and at the surface of the first region 103 which contacts the second region 105. However, the concentration of the second material decreases toward a bottom surface of the first region 103, and a difference between the concentration of the second material and the concentration of the first material is reduced toward the bottom surface of the first region 103.

The first region 103 may include some oxygen atoms. The oxygen atoms may be reduced from the top surface of the first region 103 toward the bottom surface of the first region 103 and may no longer exist at a specific depth from the top surface of the first region 103. That is, the oxygen atoms at the top surface of the first region 103 are greater than the oxygen atoms at the bottom surface of the first region 103.

The concentration of oxygen atoms may be 5% or less at the top surface of the first region 103.

In the second region 105, the concentration of the first material may be substantially equal to that of the second material. Here, the term "substantially" denotes not only exactly the same, but also permits for a margin of error that may occur during a process. Therefore, as illustrated in FIG. 25, the concentration of the first material and the concentration of the second material may not be equal in some parts of the second region 105.

In the second region 105, the oxygen atoms may hardly exist, as illustrated in FIG. 25.

The field insulating layer 110 may be disposed on the substrate 101 and may partially cover sidewalls of the fin F1, while exposing an upper part of the fin F1.

The gate structure 151 may be disposed on the fin F1 and intersect the fin F1. In FIG. 6, the gate structure 151 extends along the first direction X1. However, the present inventive concepts are not limited thereto. For example, the gate structure 151 may intersect the fin F1 at an acute angle or an obtuse angle to the fin F1.

The gate structure 151 may include a gate electrode including a first metal layer 155 and a second metal layer 157 and a gate insulating layer 153.

The gate electrode may include the first metal layer 155 and the second metal layer 157. As illustrated in FIGS. 6 through 8, the gate electrode may include a stack of two or more metal layers). The first metal layer 155 adjusts a work function, and the second metal layer 157 fills the space formed by the first metal layer 155. In an example, the first metal layer 155 may include at least one of TiAl, TiAlC, TiAlN, HfSi, TiN, TaN, TiC and TaC. In addition, the second metal layer 157 may include, for example, W or Al. Alternatively, the gate electrode including the first metal layer 155 and the second metal layer 157 may be made of a material, for example, Si or SiGe, other than a metal. In an example, the gate structure 151 may be formed by, for example, a replacement process. However, the present inventive concepts are not limited thereto.

The first metal layer may be disposed between the gate insulating layer 153 and the second metal layer 157. The second metal layer 157 may fill the space formed by the gate insulating layer 153 and the first metal layer 155.

The gate insulating layer 153 may be formed between the fin F1 and the gate electrode including the first metal layer 155 and the second metal layer 157. As illustrated in FIG. 8, the gate insulation layer 153 may be formed on the top surface and sidewalls of the fin F1. Therefore, the gate insulating layer 153 may contact the first region 103. In addition, the gate insulating layer 153 may be disposed between the gate electrode including the first metal layer 155 and the second metal layer 157 and the field insulating layer 110. The gate insulating layer 153 may include, for example, a high-k material having a higher dielectric constant than a silicon oxide layer. The gate insulating layer 153 may include, for example, $HfO_2$, $ZrO_2$, $LaO$, $Al_2O_3$, or $Ta_2O_5$. The gate insulating layer 153, the first metal layer 155 and the second metal layer 157 may cover the top sidewalls of the fin F1 exposed by the field insulating layer 110 and may cover the field insulating layer 110.

The spacers 121 may be disposed on one or more sidewalls of the gate structure 151. Each of the spacers 121 may include at least one of a nitride layer and an oxynitride layer. In an alternative embodiment, each of the spacers 121 may be a multilayer, rather than a single layer as illustrated in FIGS. 6 through 8.

The source/drain regions 123 may be disposed on one or more sides of the gate structure 151. The source/drain regions 123 may be disposed in the fin F1. The source/drain regions may be spaced apart from the first region 103 of the fin F1 by the second region 105 of the fin F1.

The source/drain regions 123 may be elevated source/drain regions. Therefore, top surfaces of the source/drain regions 123 may be higher than the top surface of the fin F1.

If the semiconductor device 6 is a PMOS transistor, the source/drain regions 123 may include a compressive stress material. The compressive stress material may be, for example, a material having a greater lattice constant than the material of the fin F1. The compressive stress material may improve the mobility of carriers in the channel region by applying compressive stress to the channel region under the gate structure 151.

If the semiconductor device 6 is an NMOS transistor, the source/drain regions 123 may include a tensile stress material. The source/drain regions 123 may include the same material as the substrate 101 or a tensile stress material. The source/drain regions 123 may include, for example, a material having a smaller lattice constant than the fin F1.

The source/drain regions 123 may be formed by epitaxial growth.

The source/drain regions 123 may be disposed such that the source/drain regions 123 do not contact the first region 103. Therefore, the source/drain regions 123 contact the second region 105. The concentration of the first material and the concentration of the second material may be substantially equal at a surface of the fin F1 which contacts each of the source/drain regions 123. That is, the concentration of the first material and the concentration of the second material may be substantially equal at a surface of the second region 105 which contacts the source/drain regions 52.

The contact metal layers 191 are disposed on the source/drain regions 123, respectively. The contact metal layers 191 may reduce the surface resistance, contact resistance, or the like, of the source/drain regions 123. The contact metal layers 123 may include, for example, Pt, Ni, Co, Au, or Al.

The contacts 193 may be formed on the contact metal layers 191, respectively. The contacts 193 may penetrate through the first and second interlayer insulating films 130 and 132 to contact the contact metal layers 191, respectively. The contacts 193 may be made of, for example, a conductive material such as W, Al or Cu.

As illustrated in the drawings, each of the contacts 193 may have a uniform thickness from the bottom toward the top thereof. However, the present inventive concepts are not limited thereto. For example, each of the contacts 193 may also become wider from the bottom toward the top thereof.

The first interlayer insulating film 130 and the second interlayer insulating film 132 may be formed sequentially on the field insulating layer 110. The first interlayer insulating film 130 may cover the contact metal layers 191 and partially cover sidewalls of the contacts 193 such that upper sidewalls of the contacts 193 are not covered by the first interlayer insulating layer 130. The second interlayer insulating film 132 may cover the remaining part of the sidewalls of the contacts 193.

As illustrated in FIG. 7, a top surface of the first interlayer insulating film 130 and a top surface of the gate structure 151 may lie in the same plane. That is, a top surface of the first interlayer insulating film 130 may be substantially level with the top surface of the gate structure 151. The top surface of the first interlayer insulating film 130 and the top surface of the gate structure 151 may be made to lie in the same plane by a planarization process, for example, a CMP process. The second interlayer insulating film 132 may be formed on the first interlayer insulating layer 130 to cover the gate structure 151, the spacers 121, and the remaining part of the contacts 193. The first and second interlayer insulating layers 130 and 132 may include, for example, at least one of an oxide layer, a nitride layer, and an oxynitride layer.

In FIGS. 6 through 8, the substrate 101 does not include the first material and the second material. However, the present inventive concepts are not limited thereto. For example, the substrate 101, like the fin F1, may also include the first and second materials.

A semiconductor device 7 according to an example embodiment of the present inventive concepts will now be described with reference to FIG. 9. For simplicity, a description of elements substantially identical to those of the previous embodiments will be omitted, and the current embodiment will hereinafter be described, focusing mainly on differences with the pervious embodiments.

Figure 9:
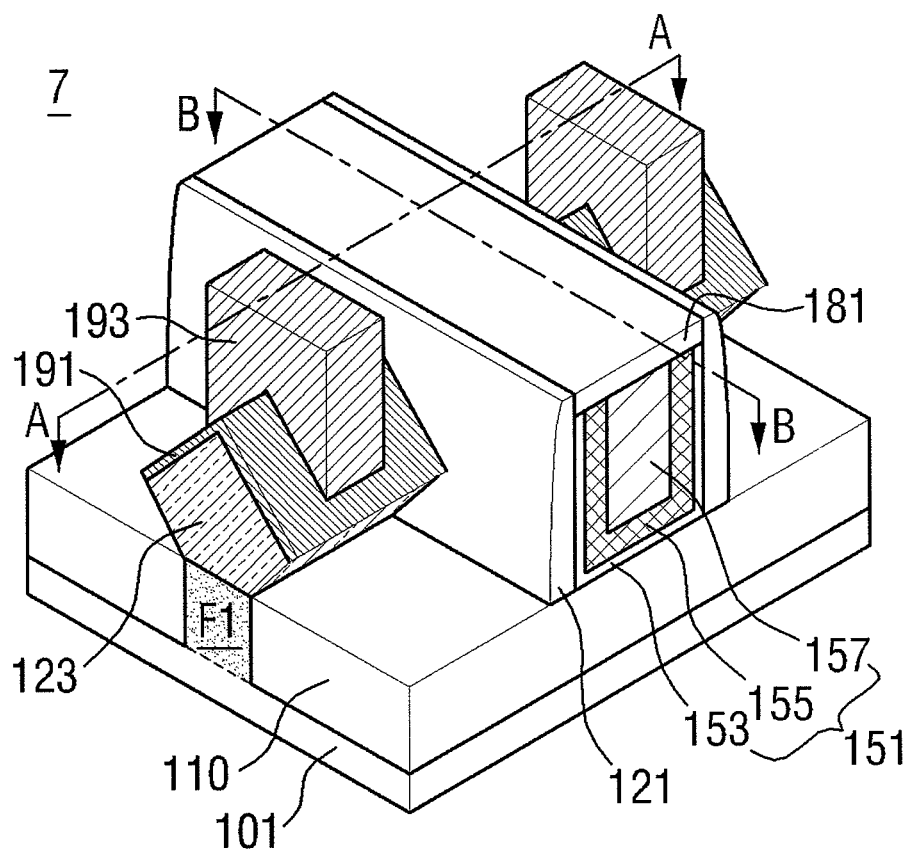
FIG. 9 is a perspective view of a semiconductor device according to an example embodiment of the present inventive concepts.

FIG. 9 is a perspective view of the semiconductor device 7 according to an example embodiment of the present inventive concepts. In FIG. 9, first and second interlayer insulating films 130 and 132 are not illustrated.

Referring to FIG. 9, the semiconductor device 7 includes a capping layer 181 in addition to the elements of the semiconductor device 6 of FIG. 6. Specifically, the capping layer 181 is disposed on a gate structure 151 such that a gate insulating layer 153 and first and second metal layers 155 and 157 are not exposed. The capping layer 181 is disposed on top surfaces of the gate insulating layer 153, the first metal layer 155 and the second metal layer 157 and along inner sidewalls of the spacers 121 such that a top surface of the capping layer 181 is substantially level with a top surface of the spacers 121.

The capping layer 181 isolates the gate structure 151 from the outside, thereby preventing a change in the performance of the gate structure 151. In addition, even if contacts 193 are misaligned, the capping layer 181 may prevent the contacts 193 from contacting the gate structure 151.

The capping layer 181 may include, for example, at least one of an oxide layer, an oxynitride layer, and a nitride layer.

A semiconductor device 8 according to an example embodiment of the present inventive concepts will now be described with reference to FIGS. 10 through 12. For simplicity, a description of elements substantially identical to those of the previous embodiments will be omitted, and the current embodiment will hereinafter be described, focusing mainly on differences with the pervious embodiments.

Figure 10:
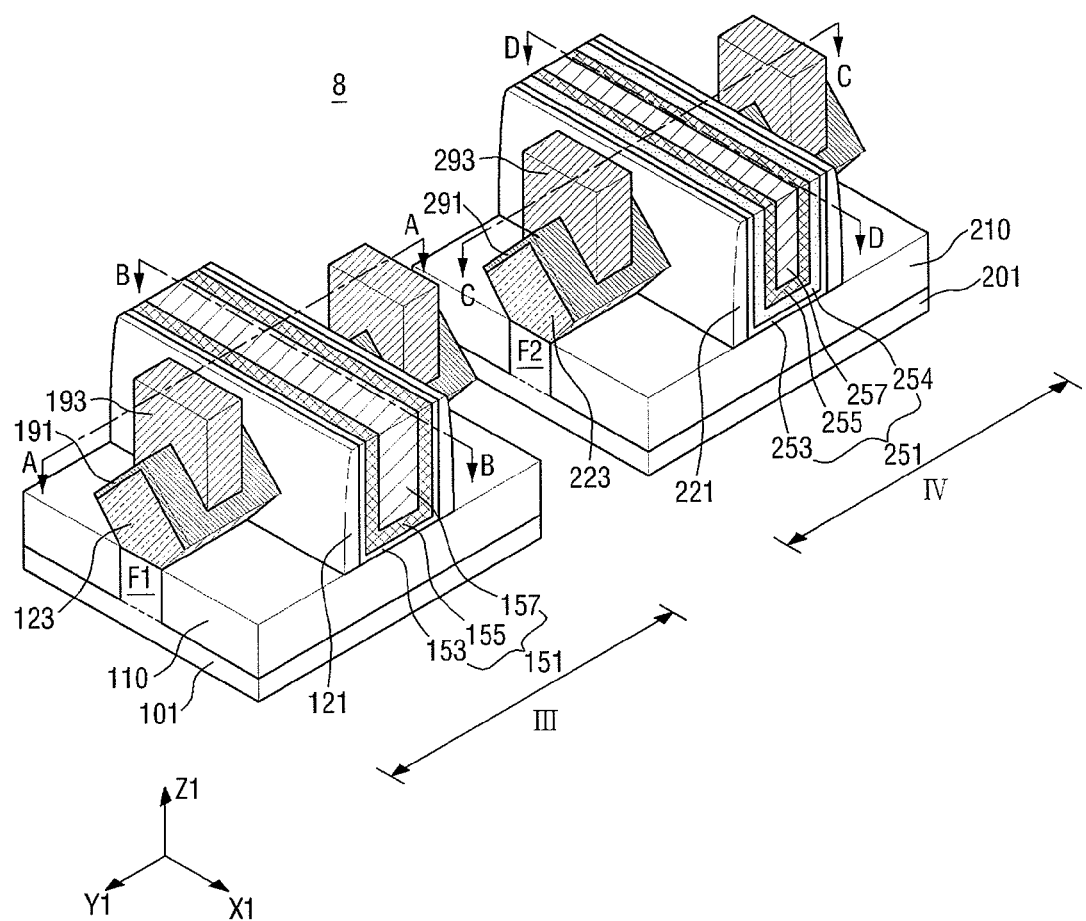
FIG. 10 is a perspective view of a semiconductor device according to an example embodiment of the present inventive concepts.
Figure 11:
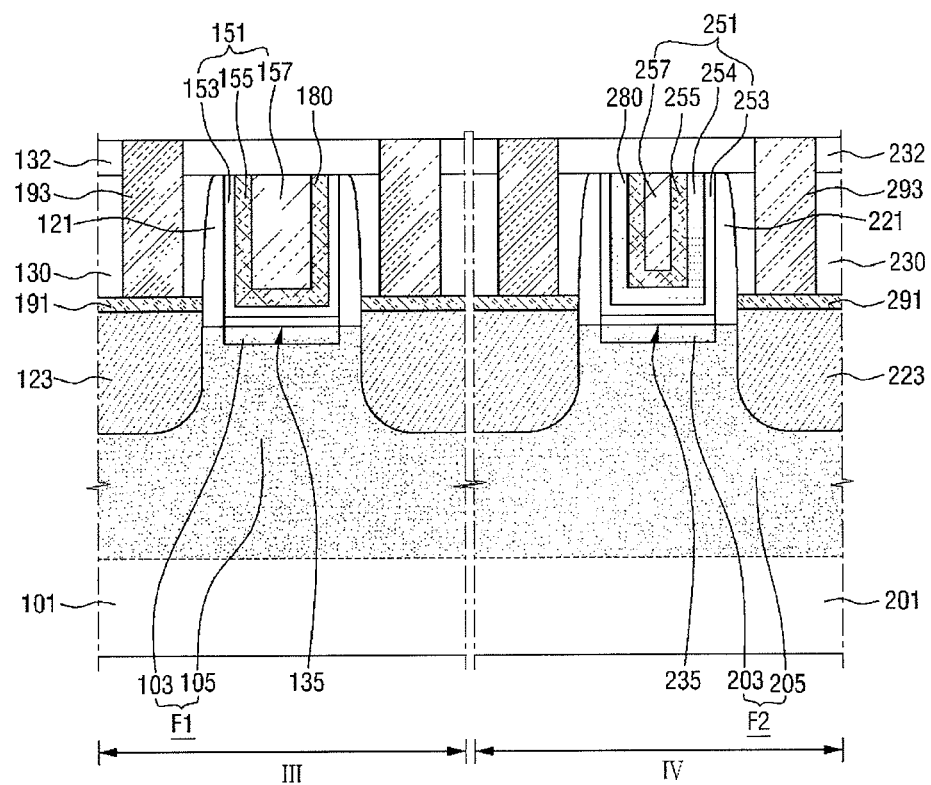
FIGS. 11 and 12 are cross-sectional views of the semiconductor device of FIG. 10.
Figure 12:
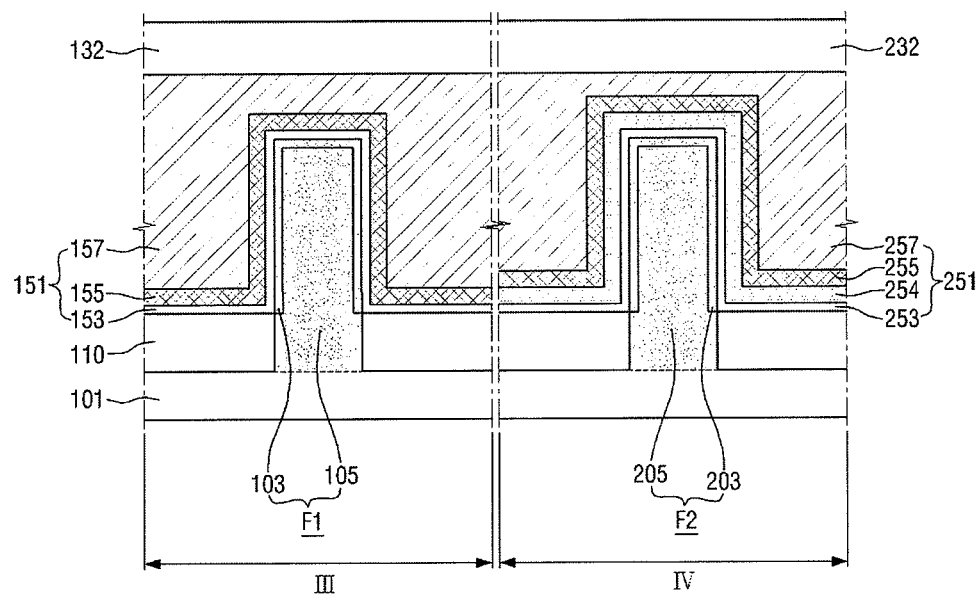

FIGS. 10 through 12 are views of the semiconductor device 8 according to an example embodiment of the present inventive concepts. Specifically, FIG. 10 is a perspective view of the semiconductor device 8 according to an example embodiment of the present inventive concepts. FIG. 11 is a cross-sectional view taken along the lines A-A and C-C of FIG. 10. FIG. 12 is a cross-sectional view taken along the lines B-B and D-D of FIG. 10. In FIG. 10, a first interlayer insulating film 130 and 230 and a second interlayer insulating film 132 and 232 are not illustrated.

Referring to FIGS. 10 through 12, a substrate 101 and a substrate 201 may be divided into an NMOS area III and a PMOS area IV. The NMOS area III and the PMOS area IV may be connected to each other or separated from each other.

The NMOS area III may be the same structure as the semiconductor device 6 of FIG. 6. Since an NMOS transistor is formed in the NMOS area III, source/drain regions 123 may include a material having a smaller lattice constant than the material of a fin F1. In addition, a first metal layer 155 may be an N-type work function control layer and, thus, may include, for example, at least one of TiAl, TiAlC, TiAlN, TaC, TiC and HfSi.

The PMOS area IV may be the same structure as the semiconductor device 6 of FIG. 6 except for a gate structure 251. In the PMOS area IV, the gate structure 251 further includes a third metal layer 254. The third metal layer 254 may be a P-type work function control layer and may include, for example, TiN. The third metal layer 254 may be disposed between a gate insulating layer 253 and a first metal layer 255. Although the first metal layer 255 is disposed on the third metal layer 254, the third metal layer 254 is responsible for controlling the work function of the gate structure 251.

Source/drain regions 223 of the PMOS area IV may include a material having a greater lattice constant than the material of, for example, a fin F2.

The fin F2, the substrate 201, a field insulating layer 210, the first and second interlayer insulating films 230 and 232, a gate insulating layer 253, first and second metal layers 255 and 257, contact metal layers 291, and contacts 293 are the same as their counterparts of the NMOS area IV, and, thus, a detailed description thereof will be omitted.

A semiconductor apparatus including any one of the semiconductor devices 1 through 8 fabricated according to the example embodiments of the present inventive concepts will now be described with reference to FIGS. 13 and 14.

Figure 13:
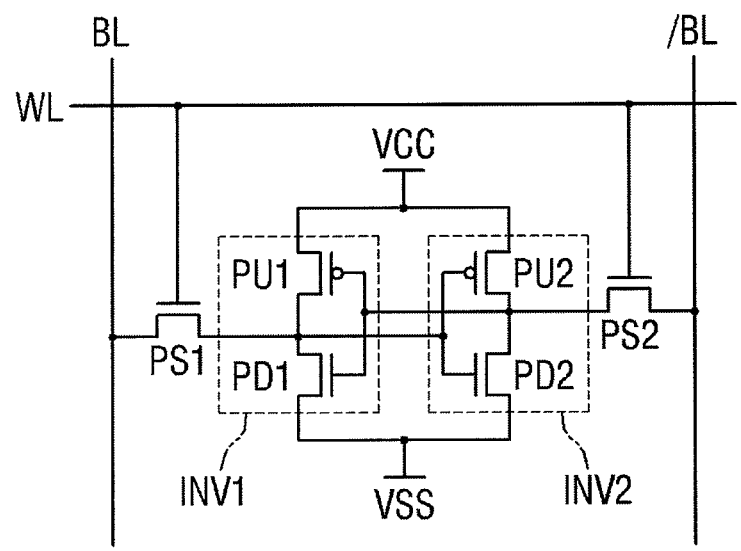
FIGS. 13 and 14 are circuit and layout diagrams of a semiconductor apparatus, respectively, including any one of the semiconductor devices of FIGS. 1 through 12 fabricated according to the example embodiments of the present inventive concepts.
Figure 14:
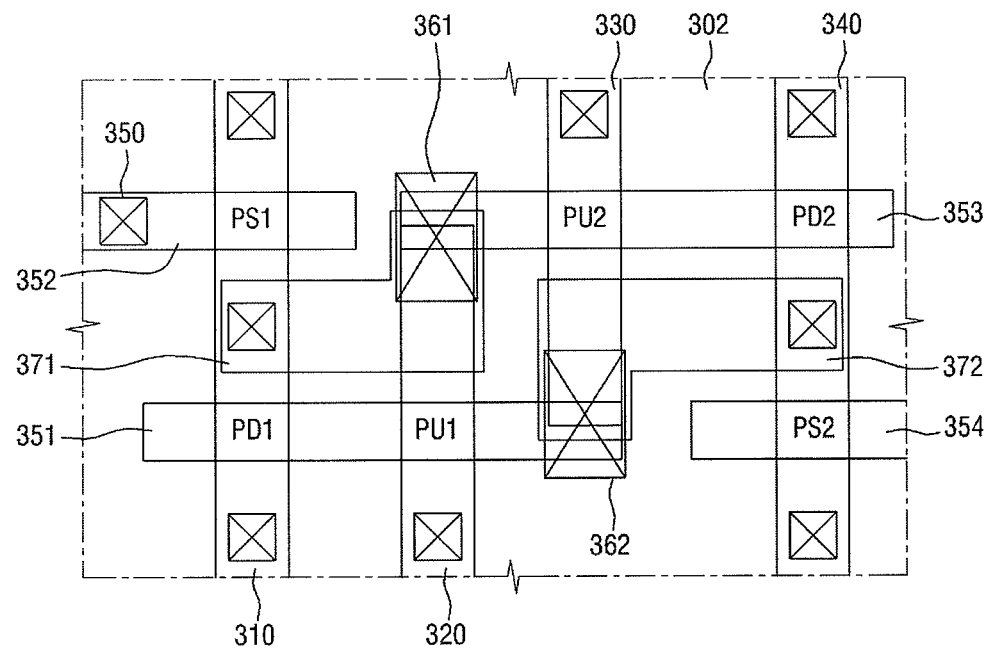

FIGS. 13 and 14 are circuit and layout diagrams of a semiconductor apparatus including any one of the semiconductor devices 1 through 8 of FIGS. 1 through 12 fabricated according to the example embodiments of the present inventive concepts. Although a static random access memory (SRAM) is illustrated in FIGS. 13 and 14, a fin transistor fabricated according to an example embodiment of the present inventive concepts may also be applied to other semiconductor apparatus.

Referring to FIG. 13, the semiconductor apparatus may include a pair of first and second inverters INV1 and INV2 connected in parallel between a power source node VCC and a ground node VSS and first and second pass transistors PS1 and PS2 connected to output nodes of the first and second inverters INV1 and INV2, respectively. The first and second pass transistors PS1 and PS2 may be connected to a bit line BL and a complementary bit line BLb, respectively. Gates of the first and second pass transistors PS1 and PS2 may be connected to a word line WL.

The first inverter INV1 includes a first pull-up transistor PU1 and a first pull-down transistor PD1 connected in series, and the second inverter INV2 includes a second pull-up transistor PU2 and a second pull-down transistor PD2 connected in series. The first and second pull-up transistors PU1 and PU2 may be PMOS transistors, and the first and second pull-down transistors PD1 and PD2 may be NMOS transistors.

An input node of the first inverter INV1 is connected to the output node of the second inverter INV2, and an input node of the second inverter INV2 is connected to the output node of the first inverter INV1, therefore, the first and second inverters INV1 and INV2 may form a single latch circuit.

Referring again to FIGS. 13 and 14, a first fin 310, a second fin 320, a third fin 330 and a fourth fin 340 may extend in a first direction, for example, a vertical direction in FIG. 14, and may be separated from each other. The second fin 320 and the third fin 330 may be shorter than the first fin 310 and the fourth fin 340.

In addition, a first gate electrode 351, a second gate electrode 352, a third gate electrode 353, and a fourth gate electrode 354 may extend in second direction, for example, a horizontal direction in FIG. 14, and intersect the first through fourth fins 310 through 340. Specifically, the first gate electrode 351 may completely intersect the first fin 310 and the second fin 320 and partially overlap an end of the third fin 330. The third gate electrode 353 may completely intersect the fourth fin 340 and the third fin 330 and partially overlap an end of the second fin 320. The second gate electrode 352 may intersect the first fin 310 and the fourth gate electrode 254 may intersect the fourth fin 340.

The first pull-up transistor PU1 may be defined near the intersection of the first gate electrode 351 and the second fin 320. The first pull-down transistor PD1 may be defined near the intersection of the first gate electrode 351 and the first fin 310. The first pass transistor PS1 may be defined near the intersection of the second gate electrode 352 and the first fin 310. The second pull-up transistor PU2 may be defined near the intersection of the third gate electrode 353 and the third fin 330. The second pull-down transistor PD2 may be defined near the intersection of the third gate electrode 353 and the fourth fin 340. The second pass transistor PS2 may be defined near the intersection of the fourth gate electrode 354 and the fourth fin 340.

Even though not specifically illustrated, recesses may be formed on both sides of each of the intersections between the first through fourth gate electrodes 351 through 354 and the first through fourth fins 310 through 340, respectively, and source/drain regions may be formed in the recesses.

A plurality of contacts 350 may also be formed.

A shared contact 361 may connect all of the second fin 320, the third gate line 353, and a wiring 371. A shared contact 362 may connect all of the third fin 330, the first gate line 351, and a wiring 372.

Each of the first pull-up transistor PU1 and the second pull-up transistor PU2 may include any one of the semiconductor devices 1 through 8 described above with reference to FIGS. 1 through 12.

Figure 15:
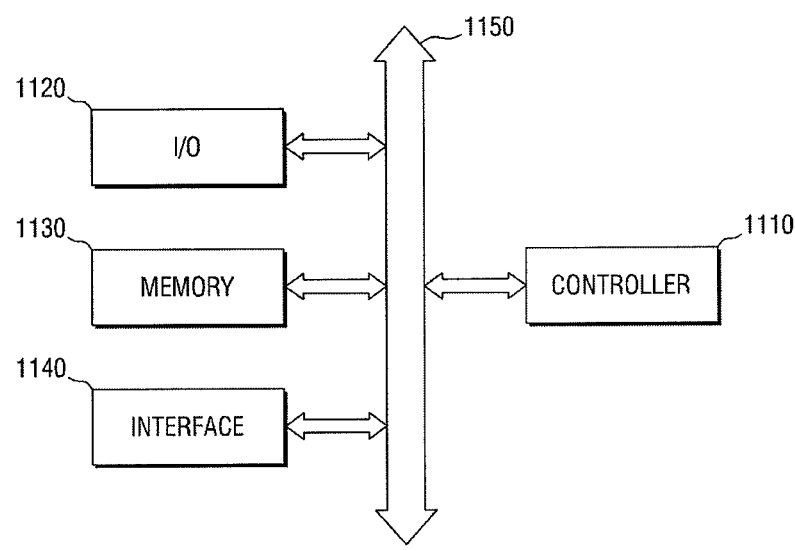
FIG. 15 is a block diagram of an electronic system including any one of the semiconductor devices of FIGS. 1 through 12 fabricated according to the example embodiments of the present inventive concepts.

FIG. 15 is a block diagram of an electronic system 1100 including any one of the semiconductor devices 1 through 8 fabricated according to the example embodiments of the present inventive concepts.

Referring to FIG. 15, the electronic system 1100 according to an example embodiment of the present inventive concepts may include a controller 1110, an input/output (I/O) device 1120, a memory device 1130, an interface 1140 and a bus 1150. The controller 1110, the I/O device 1120, the memory device 1130 and/or the interface 1140 may be connected to one another by the bus 1150. The bus 1150 may serve as a path for transmitting data.

The controller 1110 may include at least one of a microprocessor, a digital signal processor, a microcontroller and logic devices capable of performing similar functions to those of a microprocessor, a digital signal processor, a microcontroller or the like. The I/O device 1120 may include a keypad, a keyboard, a display device or the like. The memory device 1130 may store data and/or commands. The interface 1140 may be used to transmit data to or receive data from a communication network. The interface 1140 may be, for example, a wired or wireless interface. The interface 1140 may include, for example, an antenna or a wired or wireless transceiver. Although not illustrated in the drawing, the electronic system 1100 may be an operating memory for improving the operation of the controller 1110, and may also include a high-speed dynamic random access memory (DRAM) or SRAM. Here, any one of the semiconductor devices 1 through 8 according to the above-described embodiments of the present inventive concepts may be provided in the memory device 1130, in the controller 1110 and/or the I/O device 1120.

The electronic system 1100 may be applied to nearly all types of electronic products capable of transmitting and/or receiving information in a wireless environment, such as a personal digital assistant (PDA), a portable computer, a web tablet, a wireless phone, a mobile phone, a digital music player, a memory card, or the like.

Figure 16:
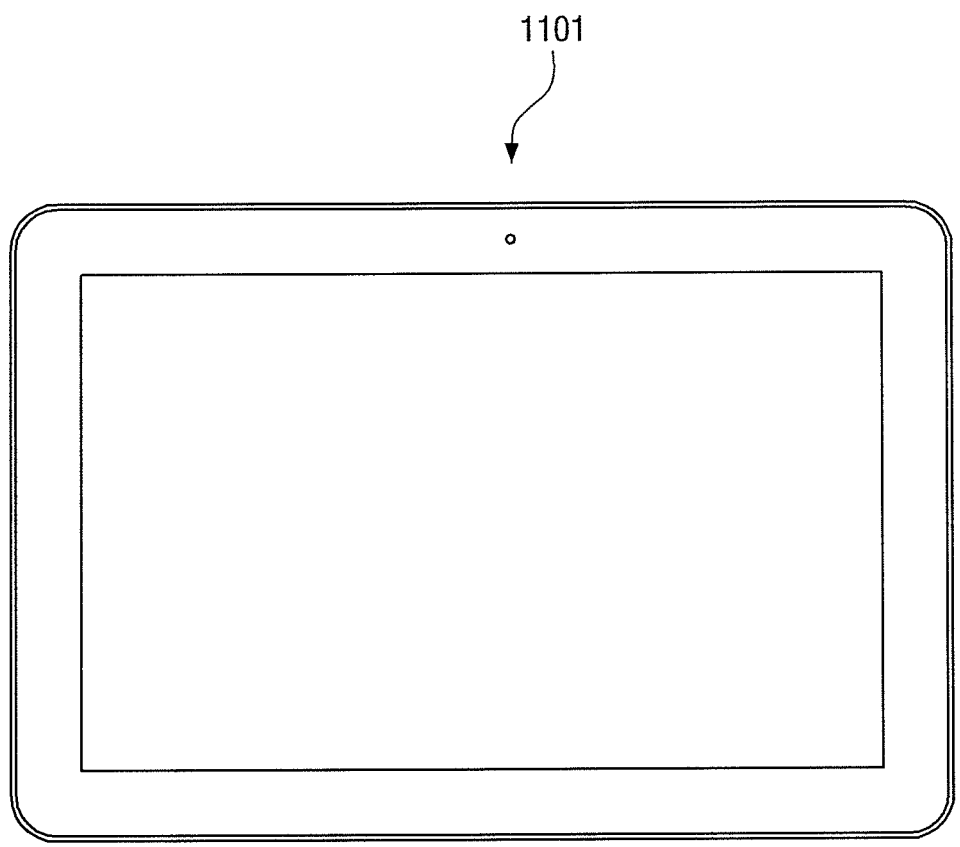
FIGS. 16 and 17 are diagrams illustrating examples of a semiconductor system to which the semiconductor devices of FIGS. 1 through 12 fabricated according to the example embodiments of the present inventive concepts may be applied.
Figure 17:
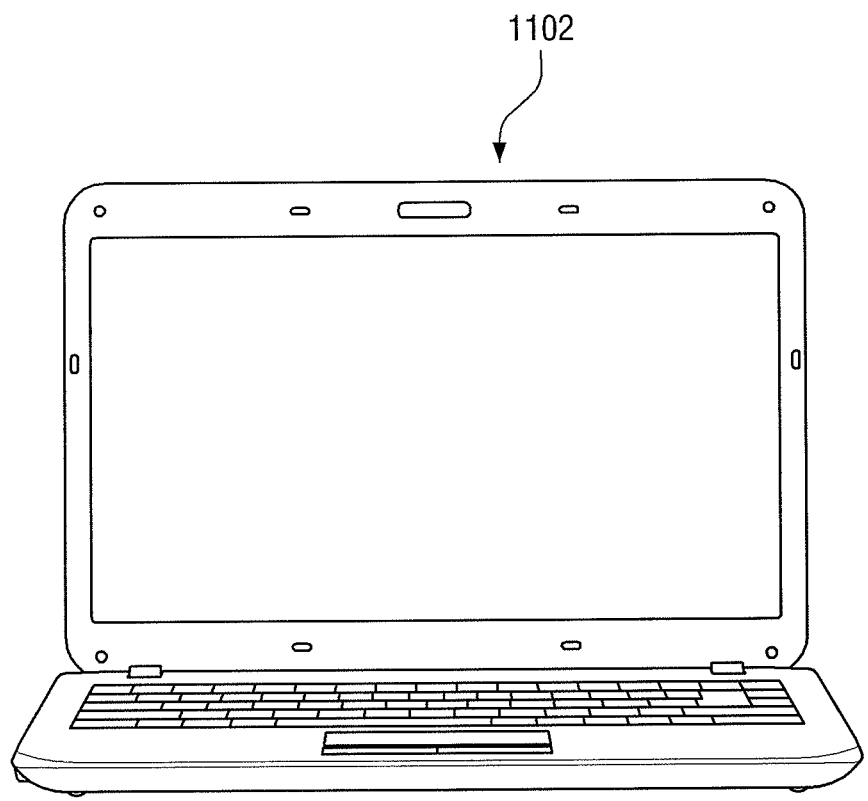

FIGS. 16 and 17 are diagrams illustrating examples of a semiconductor system to which the semiconductor devices 1 through 8 of FIGS. 1 through 12 fabricated according to the example embodiments of the present inventive concepts may be applied. FIG. 16 illustrates a tablet personal computer (PC) 1101, and FIG. 17 illustrates a notebook computer 1102. At least one of the semiconductor devices 1 through 8 of FIGS. 1 through 12 according to the above-described example embodiments of the present inventive concepts, as set forth herein, may be used in a tablet PC, a notebook computer, or the like. It is obvious to those of ordinary skill in the art that the semiconductor devices 1 through 8 of FIGS. 1 through 12 according to the example embodiments of the present inventive concepts, as set forth herein, may also be applied to various IC devices other than those set forth herein.

A method of fabricating a semiconductor device according to an example embodiment of the present inventive concepts will now be described with reference to FIGS. 1 and 18 through 27. For simplicity, a description of elements substantially identical to those described above will be omitted.

Figure 18:
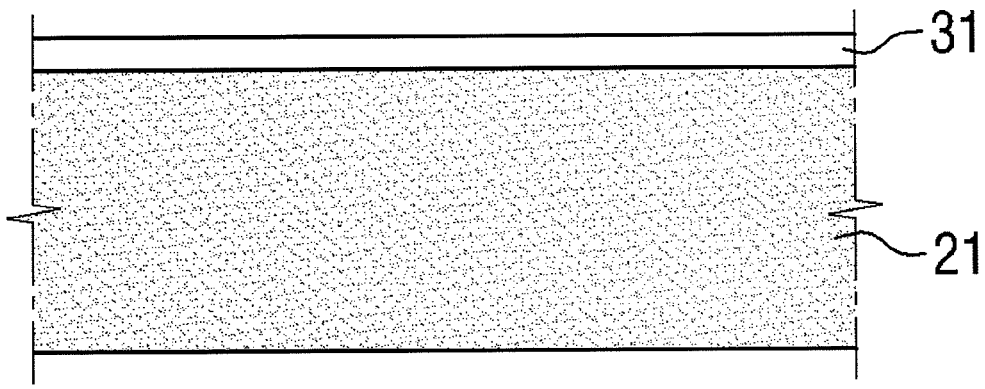
FIGS. 18, 20, 21, 22, 24, 26 and 27 are cross-sectional views illustrating steps of a method of fabricating the semiconductor device of FIG. 1 according to an embodiment of the present inventive concepts.
Figure 19:
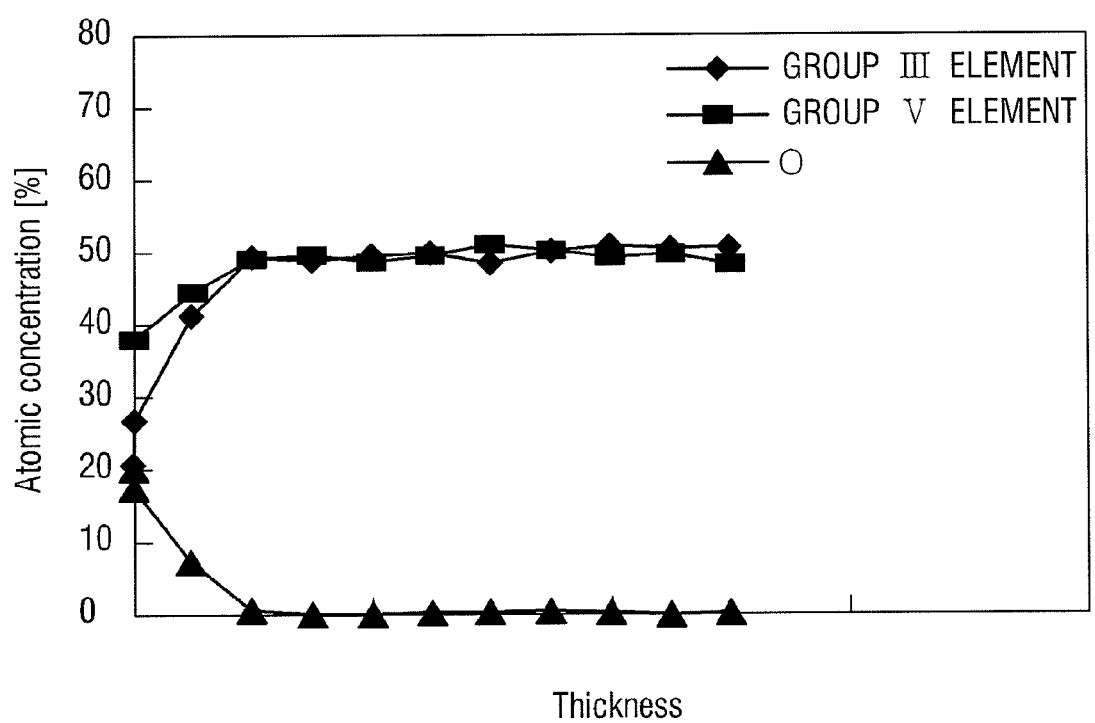
FIG. 19 is a graph illustrating the concentration of a semiconductor substrate of FIG. 18 according to an embodiment of the present inventive concepts.
Figure 21:
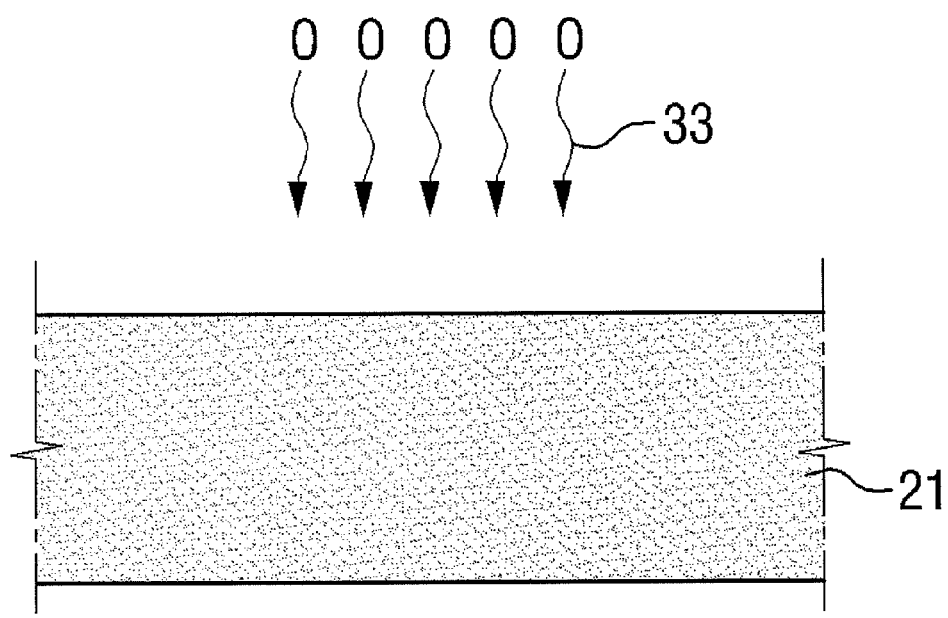
Figure 22:
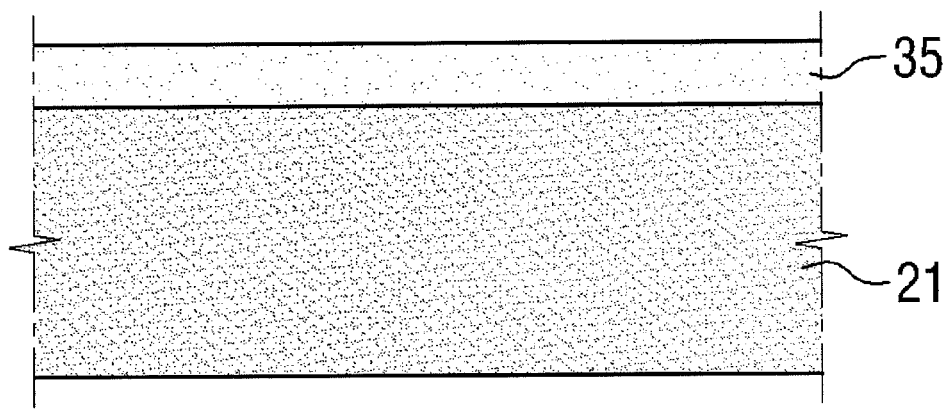
Figure 23:
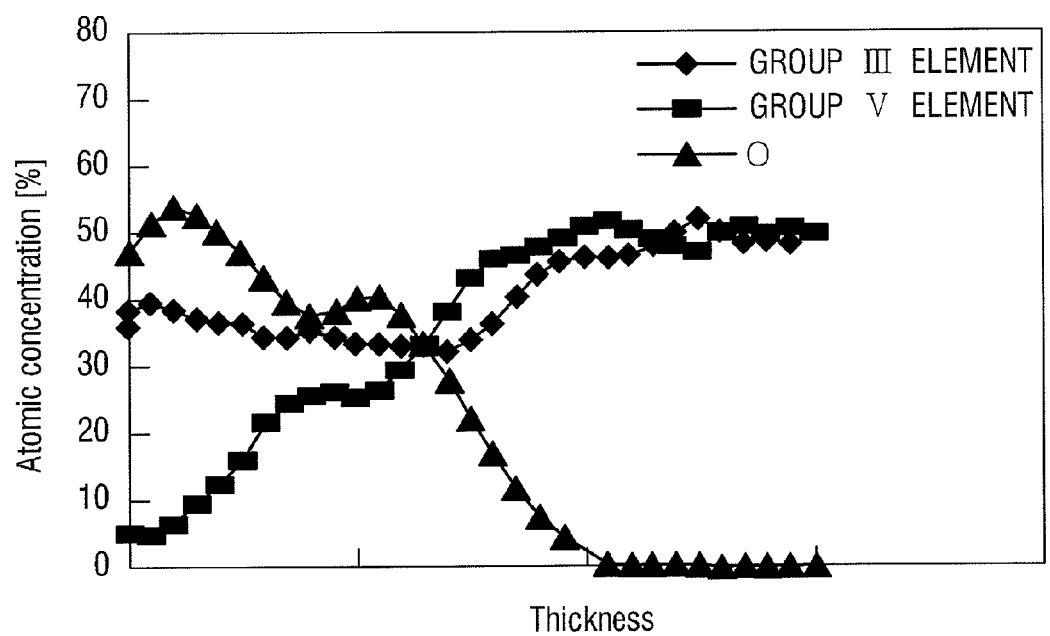
FIG. 23 is a graph illustrating the concentration of the semiconductor substrate of FIG. 22 according to an embodiment of the present inventive concepts.

FIGS. 18 through 27 are views illustrating steps of a method of fabricating a semiconductor device 1 according to an example embodiment of the present inventive concepts. Specifically, FIGS. 18, 20, 21, 22, 24, 26 and 27 are cross-sectional views. FIG. 19 is a graph illustrating the concentration of a semiconductor substrate 21 of FIG. 18, and FIG. 23 is a graph illustrating the concentration of the semiconductor substrate 21 of FIG. 22.

Referring to FIGS. 18 and 19, the semiconductor substrate 21 is provided. The semiconductor substrate 21 may include a first material and a second material. The first material may be, for example, a group III element, and the second material may be, for example, a group V element. The group III element may be at least one of, for example, Ga, In, and Al. The group V element may be at least one of, for example, P, As, and Sb. Therefore, the semiconductor substrate 21 may be made of, for example, at least one of GaAs, InGaAs, AlGaAs, InAs, GaSb, InSb, and InP.

A natural oxide layer 31 may be formed on the semiconductor substrate 21. The natural oxide layer 31 may be formed naturally, rather than artificially, by the reaction of a top surface of the semiconductor substrate 21 with oxygen atoms.

The semiconductor substrate 21 includes the first material and the second material in substantially equal concentrations. However, since the natural oxide layer 31 is formed on the top surface of the semiconductor substrate 21, the top surface of the semiconductor substrate 21 may include some oxygen atoms. Referring to FIG. 19, the concentration of oxygen atoms is high at the top surface of the semiconductor substrate 21 because oxygen atoms bond with the top surface of the semiconductor substrate 21. However, oxygen atoms hardly exist at a specific depth from the top surface of the semiconductor substrate 21, that is, within the semiconductor substrate 21. That is, the concentration of the oxygen atoms is greater at the top surface of the semiconductor substrate 21 than at the bottom of the semiconductor substrate 21. Since the top surface of the semiconductor substrate 21 includes oxygen atoms, the concentrations of the first and second materials may be low at the top surface of the semiconductor substrate 21. However, the concentrations of the first material and the second material may gradually increase as the depth from the top surface of the semiconductor substrate 21 increases and may be substantially equal at a specific depth from the top surface of the semiconductor substrate 21. The concentrations of the first material and the second material are less at the top surface of the semiconductor substrate 21 that at a bottom of the semiconductor substrate 21.

Figure 20:
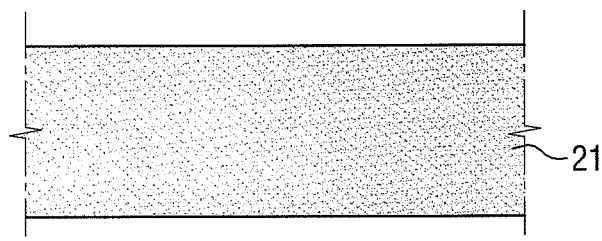

Referring to FIG. 20, the natural oxide layer 31 is removed by cleaning the top surface of the semiconductor substrate 21. Accordingly, the oxygen atoms bonded with the semiconductor substrate 21 are removed.

Referring to FIG. 21, the top surface of the semiconductor substrate 21 is oxidized by an oxidation process 33. The oxidation process 33 may be performed under high pressure. For example, the oxidation process 33 may be performed for 30 minutes to 2 hours at 5 atm or higher and at 300° C. or higher. Alternatively, the oxidation process 33 may be performed for 30 minutes to 2 hours at a high temperature of 600° C. or higher. Accordingly, as illustrated in FIG. 22, an oxide layer 35 may be artificially formed on the top surface of the semiconductor substrate 21.

The oxidation process 33 may cause the first material and the second material of the semiconductor substrate 21 to bond with oxygen atoms (O). The reactivity of the first material with the oxygen atoms in the semiconductor substrate 21 is higher than that of the second material with the oxygen atoms in the semiconductor substrate. Therefore, the first material may form more oxides than the second material. Accordingly, the oxide layer 35 may contain more oxides of the first material than oxides of the second material.

Referring to FIG. 23, since the oxygen atoms bond with the top surface of the semiconductor substrate 21 in FIG. 22, the concentration of oxygen atoms is high at the top surface of the semiconductor substrate 21. However, the concentration of oxygen atoms decreases in the semiconductor substrate 21 as the depth from the top surface of the semiconductor substrate 21 increases. In addition, since the oxygen atoms bond with the top surface of the semiconductor substrate 21, the concentrations of the first material and the second material at the top surface of the semiconductor substrate 21 are somewhat reduced.

Figure 24:
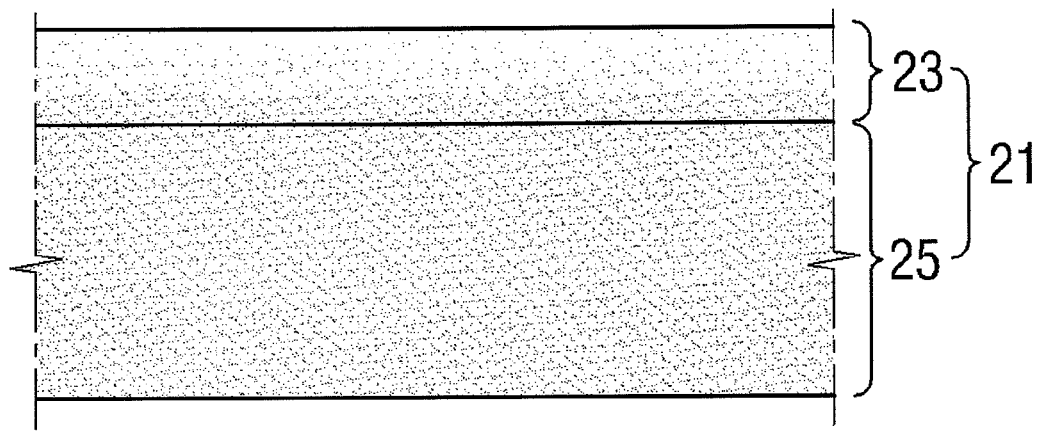

Referring to FIG. 24, the oxide layer 35 formed on the semiconductor substrate 21 is removed. To remove the oxide layer 35, a wet etching process may be performed using HF, NH4OH, HCl, or the like, as an etchant. The wet etching process may change the concentration of the first material in the semiconductor substrate 21 and the concentration of the second material in the semiconductor substrate 21. Referring to FIG. 25, the concentration of the second material at the top surface of the semiconductor substrate 21 is greater than the concentration of the first material at the top surface of the semiconductor substrate 21. The concentration of the first material in the semiconductor substrate 21 may increase as the depth from the top surface of the semiconductor substrate 21 increases, and the concentration of the first material and the concentration of the second material may be substantially equal at a specific depth from the top surface of the semiconductor substrate 21. That is, as the depth from the top surface of the semiconductor substrate 21 increases, the concentration of the second material may decrease to become substantially equal to the concentration of the first material.

Figure 27:
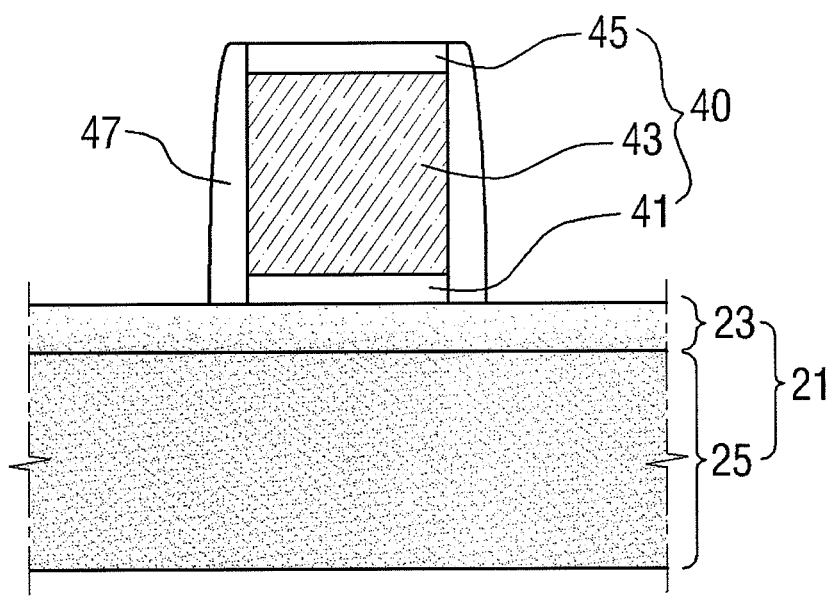

Specifically, referring to FIGS. 24 and 25, the semiconductor substrate 21 includes a first region 23 and a second region 25. The first region 23 may be located at the top surface of the semiconductor substrate 21, and the second region 25 may be disposed under the first region 23 of the semiconductor substrate 21. The first region 23 may contact a gate structure 40 which will be formed later, as illustrated in FIG. 27. The first region 21 may have a thickness of, for example, 1 to 20 nm.

Referring to FIG. 25, the concentration of the first material in the first region 23 increases gradually from a top surface of the first region 23 toward a bottom surface of the first region 23. That is, the concentration of the first material at the top surface of the first region 23 is less than the concentration of the first material at the bottom surface of the first region 23. The concentration of the first material at the top surface of the first region 23 is 10% or less. In the first region 23, the concentration of the first material is lower than that of the second material.

In the first region 23, the concentration of the second material is higher than that of the first material. That is, the concentration of the second material is higher than the first material at the top surface of the first region 23 and at the bottom surface of the first region 23. However, the concentration of the second material decreases toward the bottom surface of the first region 23, and a difference between the concentration of the second material and the concentration of the first material is reduced toward the bottom surface of the first region 23.

The first region 23 may include oxygen atoms which have not been removed by the wet etching process. The oxygen atoms may be reduced from the top surface of the first region 23 toward the bottom surface of the first region 23 and may no longer exist at a specific depth from the top surface of the first region 23. That is, the oxygen atoms at the top surface of the first region 23 are greater than the oxygen atoms at the bottom surface of the first region 23. The concentration of oxygen atoms may be 5% or less at the top surface of the first region 23.

In the second region 25, the concentration of the first material may be substantially equal to that of the second material. Here, the term "substantially" denotes not only exactly the same, but also permits for a margin of error that may occur during a process. Therefore, as illustrated in FIG. 25, the concentration of the first material and the concentration of the second material may not be equal in some parts of the second region 25.

In the second region 25, the oxygen atoms may hardly exist, as illustrated in FIG. 25.

Figure 26:
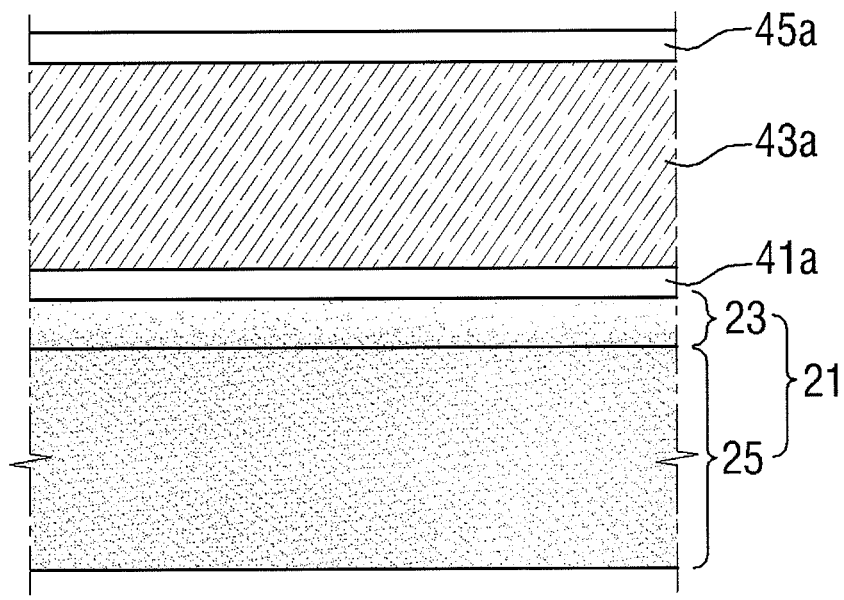

Referring to FIG. 26, a gate insulating layer 41*a*, a gate electrode 43*a*, and a hard mask layer 45*a* may be sequentially formed on the semiconductor substrate 21.

The gate insulating layer 41*a* may be formed to contact the first region 23 of the semiconductor substrate 21. The gate insulating layer 41*a* may include, for example, a material selected from the group consisting of, e.g., HfSiON, HfO$_2$, ZrO$_2$, Al$_2$O$_3$, Ta$_2$O$_5$, TiO$_2$, SrTiO$_3$, and (Ba,Sr)TiO$_3$. Alternatively, the gate insulating layer 41 may be, for example, a silicon oxide layer. The gate insulating layer 41*a* may be formed by, for example, atomic layer deposition (ALD) or chemical vapor deposition (CVD).

The gate electrode 43*a* may be disposed on the gate insulating layer 41*a*. The gate electrode 43*a* may include, for example, a conductive material such as polysilicon.

The hard mask layer 45*a* may be disposed on the gate insulating layer 41*a*. The hard mask layer 45*a* may include, for example, at least one of an oxide layer, a nitride layer, and an oxynitride layer.

Referring to FIG. 27, the gate structure 40 may be formed by patterning the gate insulating layer 41*a*, the gate electrode 43*a*, and the hard mask layer 45*a*.

Then, spacers 47 may be formed on one or more sides of the gate structure 40. The spacers 47 may be formed on one or more sides of the gate structure 40 by forming a spacer layer (not illustrated) to cover the semiconductor substrate 21 and the gate structure 40 and then etching back the spacer layer.

The spacers 47 may include, for example, at least one of oxide, oxynitride, and nitride.

Finally, source/drain regions 51 may be formed in the semiconductor substrate 21 on one or more sides of the gate structure 40, thereby completing the semiconductor device 1 of FIG. 1.

Figure 28:
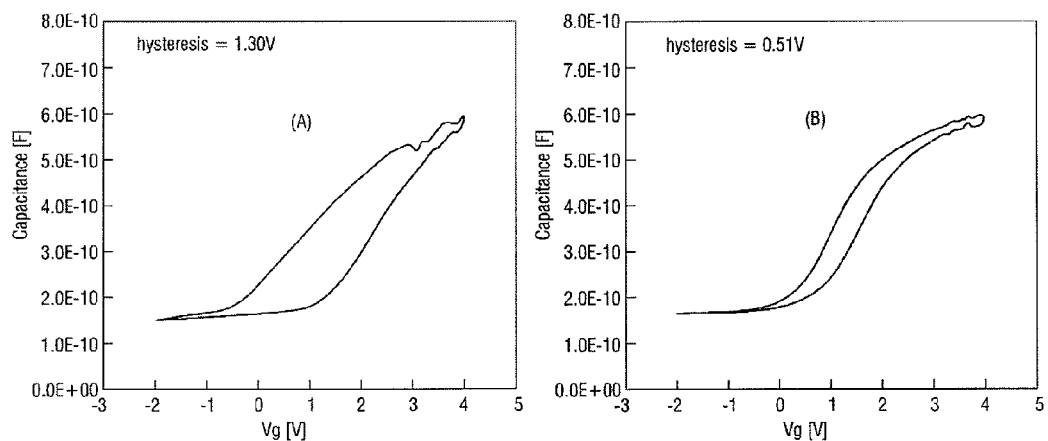
FIG. 28 is graphs illustrating the effects of the present inventive concepts.

The effects of the present inventive concepts will now be described with reference to FIG. 28. FIG. 28 is a graph illustrating the effects of the present inventive concepts.

In FIG. 28, two graphs A and B are illustrated. A of FIG. 28 is a graph illustrating capacitance C-gate voltage Vg measured after the gate structure 40 is formed on the semiconductor substrate 21. B of FIG. 28 is a graph illustrating the capacitance C-gate voltage Vg of the semiconductor device 1 according to the example embodiment of FIG. 1. Hysteresis was measured to be 1.30 V on the graph A and 0.51 V on the graph B.

In the present inventive concepts, an oxide layer may be formed by oxidizing the semiconductor substrate 21 and, then, may be removed to change the concentration of the first material at the top surface of the semiconductor substrate 21 and the concentration of the second material at the top surface of the semiconductor substrate 21. This improves hysteresis characteristics as shown on the graph B of FIG. 28. Consequently, a transistor may have a low density of interface trap charge (DIT). Therefore, a transistor having superior performance may be fabricated.

A method of fabricating a semiconductor device according to an example embodiment of the present inventive concepts will now be described with reference to FIGS. 3 and 29 through 35. For simplicity, a description of elements substantially identical to those described above will be omitted.

FIGS. 29 through 35 are cross-sectional views illustrating steps of a method of fabricating the semiconductor device 3 according to an example embodiment of the present inventive concepts.

Figure 29:
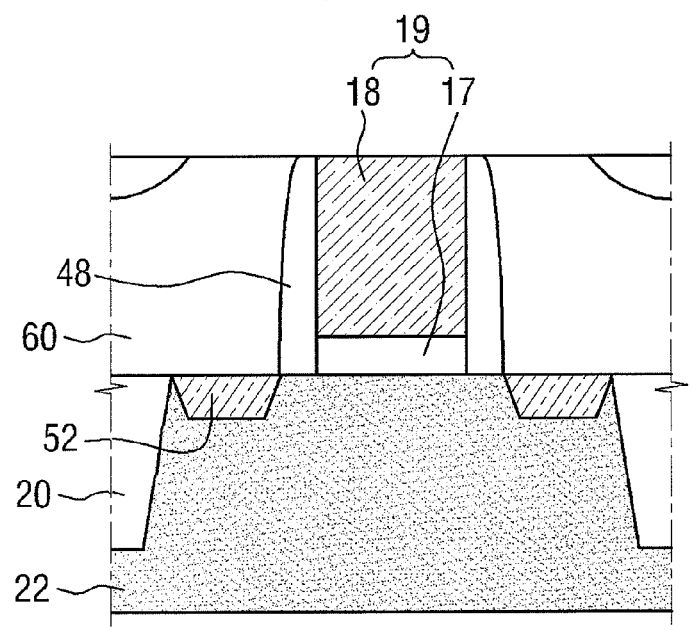
FIGS. 29 through 35 are cross-sectional views illustrating steps of a method of fabricating the semiconductor device of FIG. 3 according to an example embodiment of the present inventive concepts.

Referring to FIG. 29, a semiconductor substrate 22 is provided. The semiconductor substrate 22 may include a first material and a second material. The first material in the semiconductor substrate 22 may be, for example, a group III element, and the second material in the semiconductor substrate 22 may be, for example, a group V element. The group III element may be, for example, at least one of Ga, In, and Al. The group V element may be, for example, at least one of P, As, and Sb. Therefore, the semiconductor substrate 22 may be made of, for example, at least one of, e.g., GaAs, InGaAs, AlGaAs, InAs, GaSb, InSb, and InP. In the semiconductor substrate 22, the concentration of the first material may be substantially equal to the concentration of the second material.

Device isolation layers 20, for example, STI layers may be formed in the semiconductor substrate 22 to define an active region.

Then, a dummy gate structure 19 may be formed. The dummy gate structure 19 may include a dummy gate insulating layer 17 and a dummy gate electrode 18. The dummy gate insulating layer 17 may be formed on the semiconductor substrate 22 and may be, for example, a silicon oxide layer. The dummy gate electrode 18 may be formed on the dummy gate insulating layer 17. The dummy gate electrode 18 may include, for example, polysilicon.

Spacers 48 may be formed on one or more sidewalls of the dummy gate structure 19. The spacers 48 may include, for example, oxide, nitride, or oxynitride. The spacers 48 may be formed on one or more sidewalls of the dummy gate structure 19 by forming a spacer layer (not illustrated) using a CVD process and, then, etching back the spacer layer. Here, the shape of the spacers 48 is not limited to the shape illustrated in the drawing.

Source/drain regions 52 may be formed in the semiconductor substrate 22 by using the dummy gate structure 19 and the spacers 48 as a mask. The source/drain regions 52 may be formed between the device isolation layers 20 and the spacers 48. A channel region under the dummy gate structure 19 may be a region through which N-type carriers included in the source/drain regions 52 or P-type carriers included in the source/drain regions 52 are moved.

A first interlayer insulating film 60 may be formed on the semiconductor substrate 22. The first interlayer insulating film 60 may cover the sidewalls of the spacers 48 and expose a top surface of the dummy gate structure 19 and a top surface of the spacers 48. To expose the top surface of the dummy gate structure 19, a planarization process may be performed after the formation of the first interlayer insulating film 60. In an alternative embodiments, the first interlayer insulating film 60 may also be formed by stacking two or more insulating layers.

Figure 30:
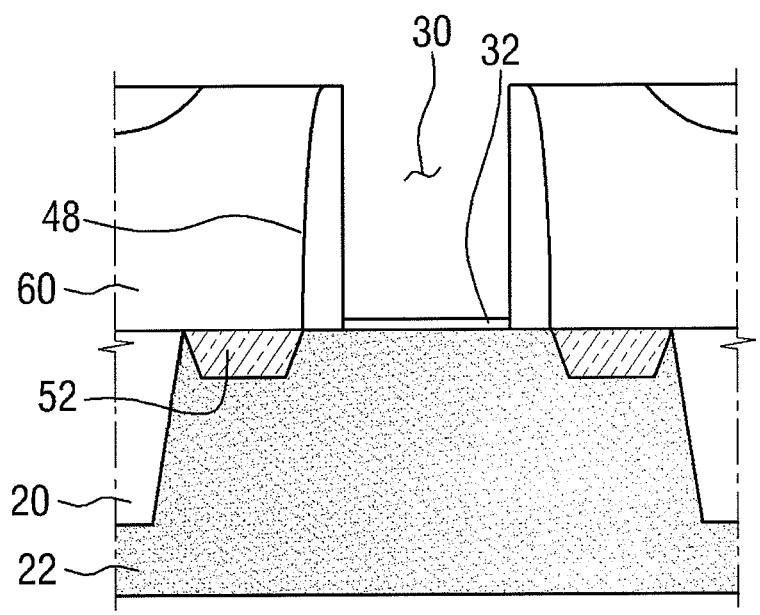

Referring to FIG. 30, a trench 30 may be formed by removing the dummy gate structure 19.

The trench 30 may expose the sidewalls of the spacers 49 and the top surface of the semiconductor substrate 22. That is, the top surface of the semiconductor substrate 22 between the spacers 48 may be exposed. The exposed top surface of the semiconductor substrate 22 reacts with oxygen atoms, thereby forming a natural oxide layer 32 in the trench 30.

Figure 31:
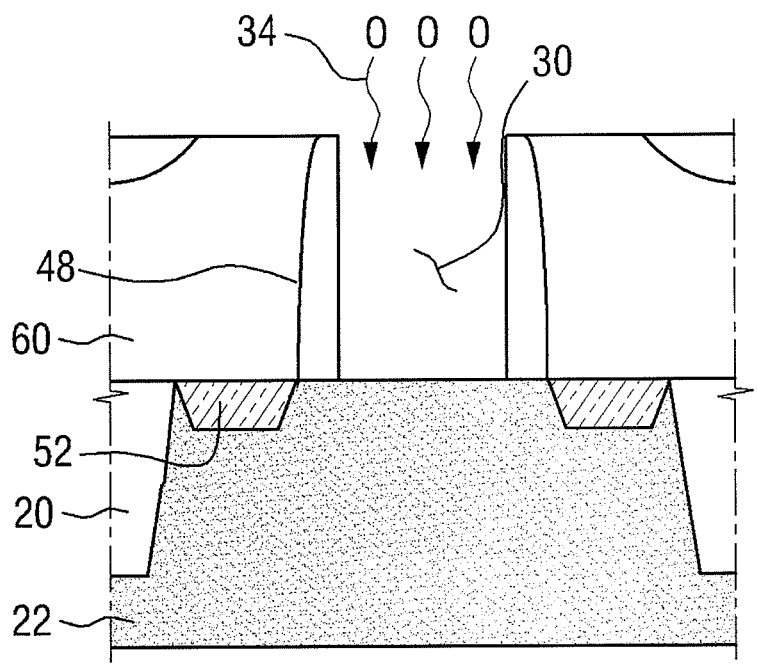

Referring to FIG. 31, the natural oxide layer 32 formed on the semiconductor substrate 22 may be removed. Then, the exposed top surface of the semiconductor substrate 22 within the trench 30 is oxidized by an oxidation process 34. The oxidation process 34 may be performed for 30 minutes to 2 hours at 5 atm or higher and at 300° C. or higher. Alternatively, the oxidation process 34 may be performed for 30 minutes to 2 hours at a high temperature of 600° C. or higher.

Figure 32:
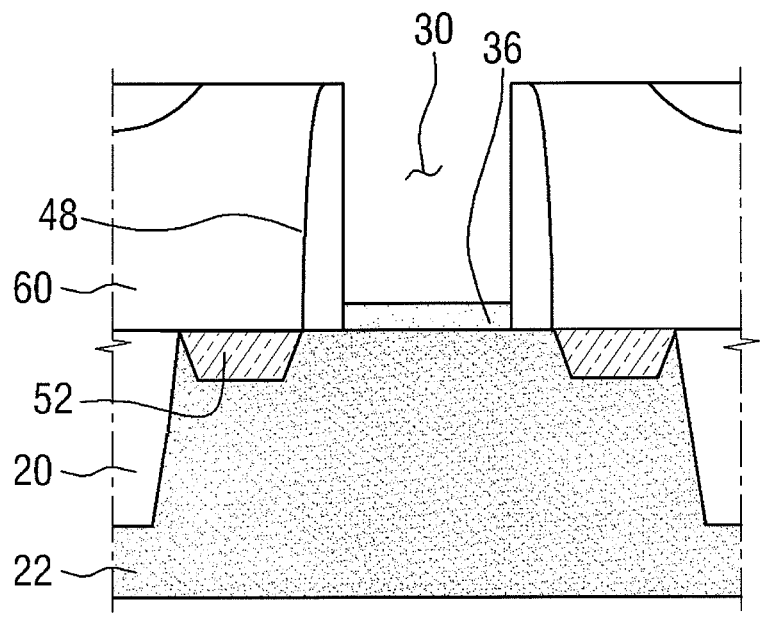

Referring to FIG. 32, an oxide layer 36 may be formed on the top surface of the semiconductor substrate 22 by the oxidation process 34. The oxide layer 36 may be formed by the reaction of oxygen with the first and second materials included in the semiconductor substrate 22. In the oxidation process 34 which is performed under the above condition, the first material may bond with more oxygen atoms than the second material.

Figure 33:
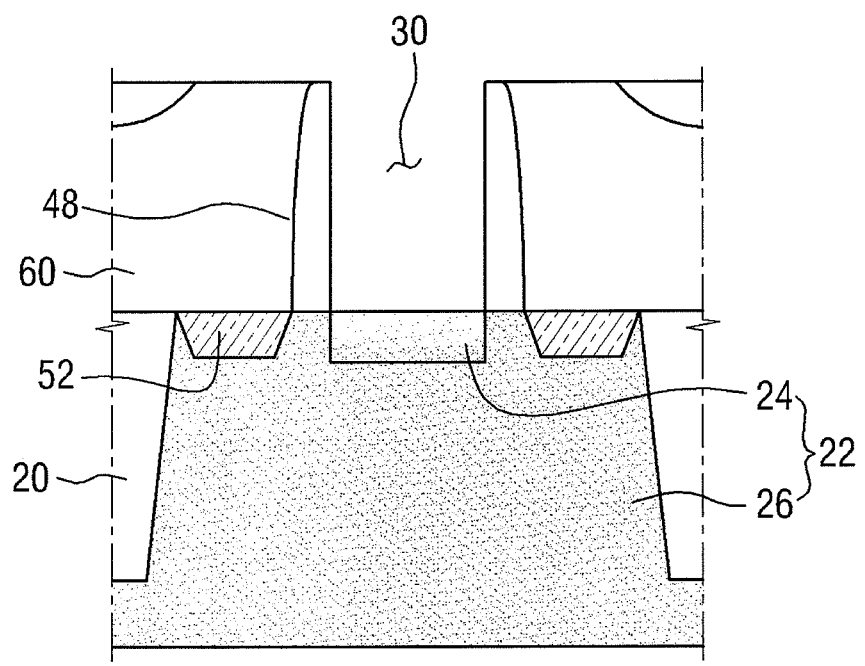

Referring to FIG. 33, the oxide layer 36 may be removed. To remove the oxide layer 36, a wet etching process may be performed using, for example, HF, NH4OH, HCl, or the like, as an etchant.

The removal of the oxide layer 36 may change the concentration of the first material in the channel region of the semiconductor substrate 22 and the concentration of the second material in the channel region of the semiconductor substrate 22. The concentration of the first material in the semiconductor substrate 22 may gradually increase as the depth from a top surface of the channel region of the semiconductor substrate 22 increases.

Specifically, the channel region of the semiconductor substrate 22 includes a first region 24 and a second region 26. The first region 24 is located at the top surface of the channel region of the semiconductor substrate 22, and the second region 26 is disposed under the first region 24. The first region 24 may contact a gate structure 39 which will be formed later. The first region 24 may have a thickness of, for example, 1 to 20 nm.

In the first region 24, the concentration of the first material increases gradually from a top surface of the first region 24 toward a bottom surface of the first region 24. That is, the concentration of the first material at the top surface of the first region 24 is less than the concentration of the first material at the bottom surface of the first region 24. The concentration of the first material at the top surface of the first region 24 is 10% or less. In the first region 24, the concentration of the first material is lower than that of the second material.

In the first region 24, the concentration of the second material is higher than that of the first material. That is, the concentration of the second material is higher than the first material at the top surface of the first region 24 and at the bottom surface of the first region 24. However, the concentration of the second material decreases toward the bottom surface of the first region 24, and a difference between the concentration of the second material and the concentration of the first material is reduced toward the bottom surface of the first region 24.

The first region 24 may include oxygen atoms which have not been removed by the wet etching process. The oxygen atoms may be reduced from the top surface of the first region 24 toward the bottom surface of the first region 24 and may no longer exist at a specific depth from the top surface of the first region 24. That is, the oxygen atoms at the top surface of the first region 24 are greater than the oxygen atoms at the bottom surface of the first region 24. The concentration of oxygen atoms may be 5% or less at the top surface of the first region 24.

In the second region 26, the concentration of the first material may be substantially equal to that of the second material. Here, the term "substantially" denotes not only exactly the same, but also permits for a margin of error that may occur during a process. Therefore, the concentration of the first material and the concentration of the second material may not be equal in some parts of the second region 26.

In the second region 26, the oxygen atoms may hardly exist.

Each of the source/drain regions 52 and the first region 24 may be separated by a width of each of the spacers 48. Therefore, the concentration of the first material may be substantially equal to that of the second material at the surface of the semiconductor substrate 22 which contacts the source/drain regions 52. That is, the concentration of the first material and the concentration of the second material may be substantially equal at a surface of the second region 26 which contacts the source/drain regions 52.

Figure 34:
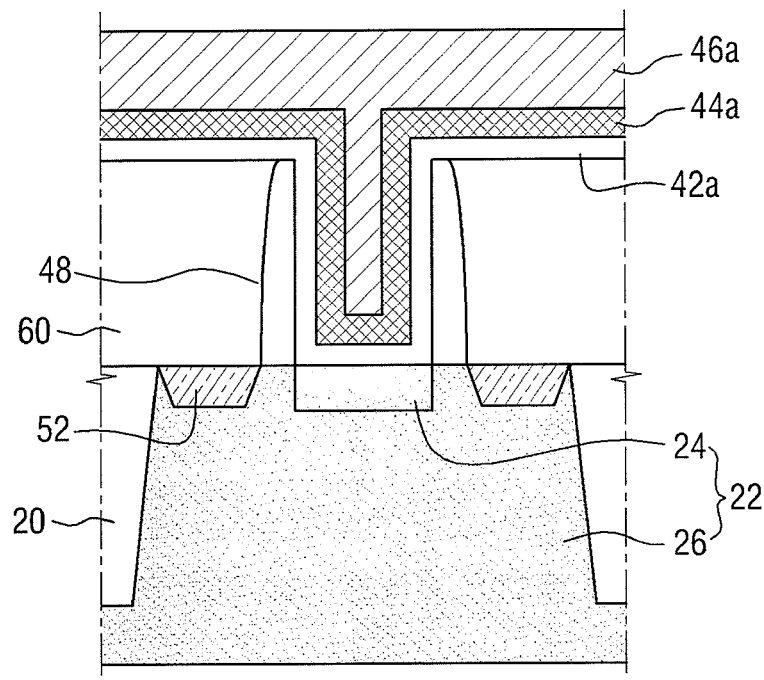

Referring to FIG. 34, a gate insulating layer 42a, a work function control layer 44a, and a gate metal 46a may be formed sequentially in the trench 30.

The gate insulating layer 42a may be formed in the trench 30. Specifically, the gate insulating layer 42a may be formed conformally along the sidewalls of the spacers 48 and the top surface of the first region 24. Therefore, the gate insulating layer 42a formed in the trench 30 may be concave in shape. The gate insulating layer 42a may contact the first region 24 of the semiconductor substrate 22.

The work function control layer 44a may be formed on the gate insulating layer 42a. Specifically, the work function control layer 44a may be formed conformally along the sidewalls of the spacers 48 and the top surface of the first region 24. Therefore, the work function control layer 44a may be concave in shape.

The gate metal 46a may be formed on the work function control layer 44a to fill the trench 30. That is, the gate metal 46a may fill the remaining portion of the trench 30.

Figure 35:
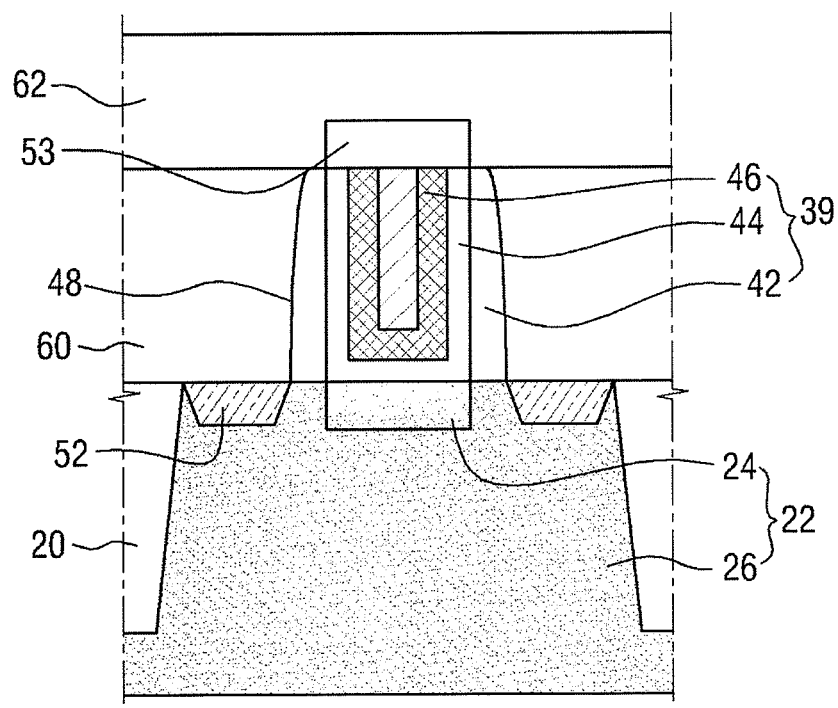

Referring to FIG. 35, the first interlayer insulating film 60 may be exposed. To expose the first interlayer insulating film 60, a planarization process may be performed. Accordingly, the gate structure 39 including a gate insulating layer 42, a work function control layer 44 and a gate electrode 46 may be formed, and a top surface of the gate structure 39 and a top surface of the first interlayer insulating film 60 may lie in the same plane.

Then, a capping layer 53 may be formed on the gate structure 39. The capping layer 53 may cover the gate structure 39 such that the gate insulating layer 42, the work function control layer 44 and the gate electrode 46 are not exposed.

A second interlayer insulating film 62 is formed on the first interlayer insulating film 60. The second interlayer insulating film 62 may cover the capping layer 53.

Contact holes 70 may be formed to penetrate through the first and second interlayer insulating films 60 and 62 and expose the source/drain regions 52, and a contact metal layer 72 and a contact 76 are formed sequentially in each of the contact holes 70, thereby completing the semiconductor device 3 of FIG. 3.

A method of fabricating a semiconductor device 6 according to an example embodiment of the present inventive concepts will now be described with reference to FIGS. 6 through 8 and 36 through 57. For simplicity, a description of elements substantially identical to those described above will be omitted.

Figure 55:
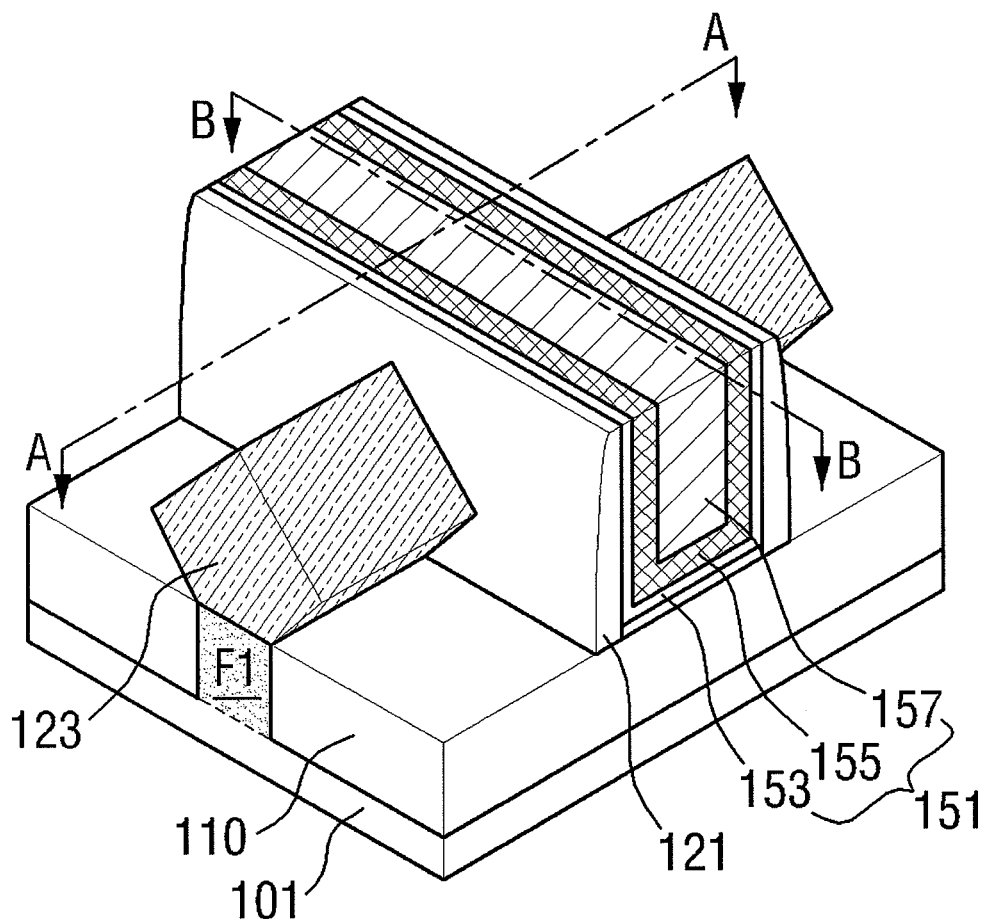
Figure 56:
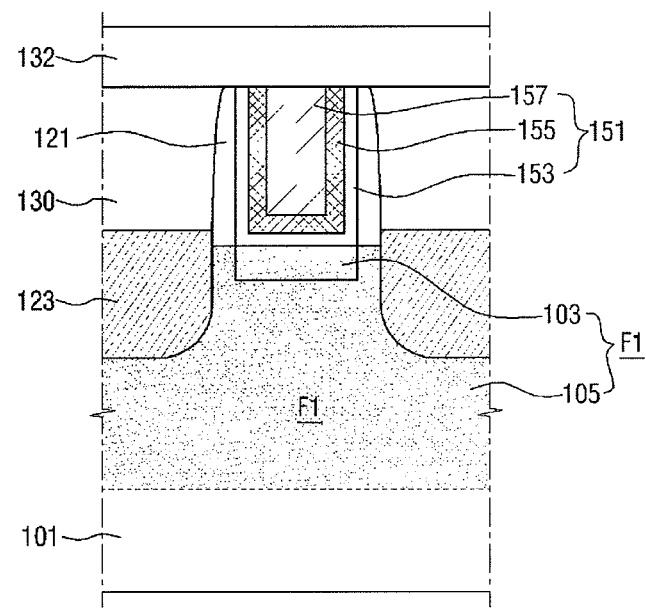
FIG. 56 is a cross-sectional view taken along the line A-A of FIG. 55.
Figure 57:
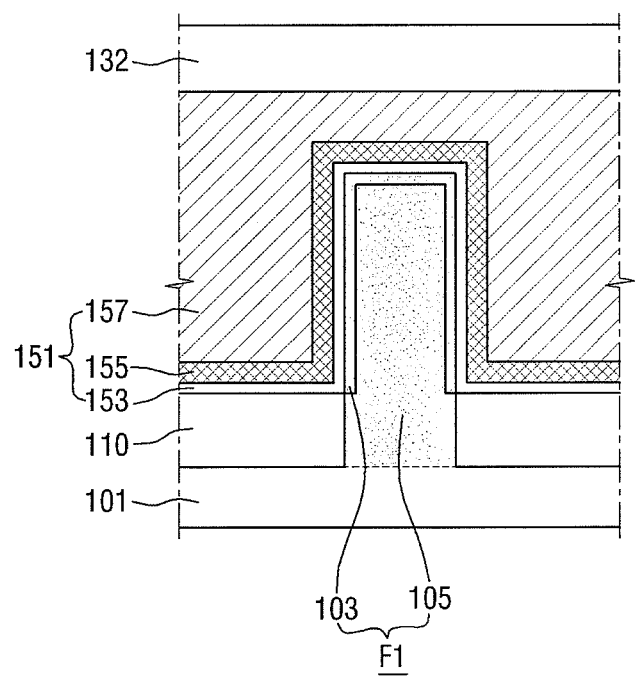
FIG. 57 is a cross-sectional view taken along the line B-B of FIG. 55.

FIGS. 36 through 57 are views illustrating steps of a method of fabricating the semiconductor device 6 according to an example embodiment of the present inventive concepts. Specifically, FIGS. 35 through 39 and 55 are perspective views. FIGS. 40, 42, 43, 45, 47, 49, 51 and 53 are cross-sectional views taken along the line A-A of FIG. 39. FIGS. 41, 44, 46, 48, 50 and 52 are cross-sectional views taken along the line B-B of FIG. 39. FIG. 56 is a cross-sectional view taken along the line A-A of FIG. 55. FIG. 57 is a cross-sectional view taken along the line B-B of FIG. 55. In FIG. 55, first and second interlayer insulating films 130 and 132 are not illustrated.

Figure 36:
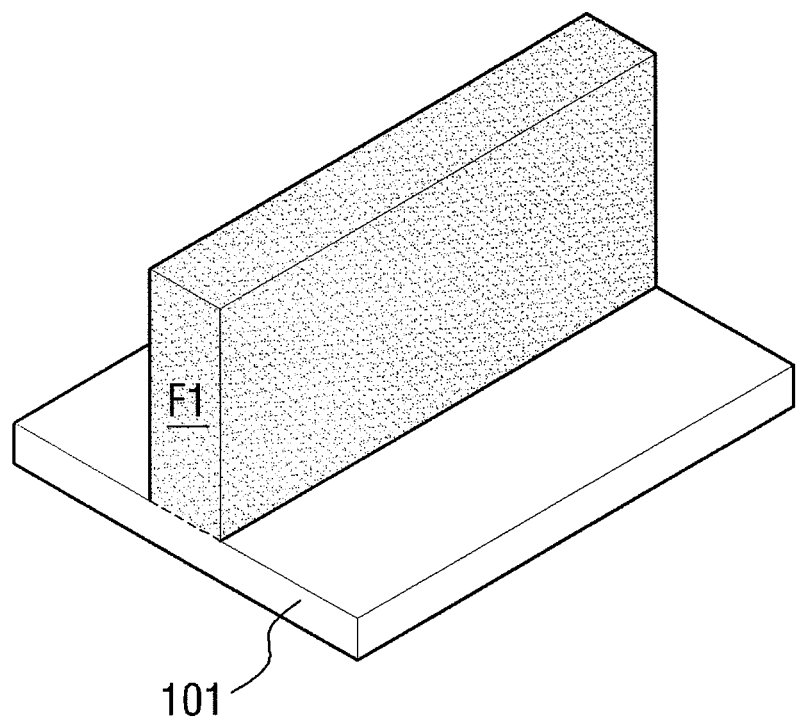

Referring to FIG. 36, a fin F1 may be formed on a substrate 101. The fin F1 may protrude from the substrate 101 in a third direction Z1. The fin F1 may extend along a second direction Y1, which is a lengthwise direction. The fin F1 may have long sides in the second direction Y1 and short sides in a first direction X1, which is a widthwise direction. However, the present inventive concepts are not limited thereto. For example, a long-side direction may also be the first direction X1, and a short-side direction may also be the second direction Y1.

The fin F1 may be part of the substrate 101 and may include an epitaxial layer grown from the substrate 101. The fin F1 may include a first material and a second material.

Specifically, the substrate 101 may be made of, for example, one or more semiconductor materials selected from the group consisting of Si, Ge, SiGe, GaP, GaAs, SiC, SiGeC, InAs, and InP. The substrate 101 may also be, for example, an SOI substrate.

The fin F1 may include the first material and the second material. The first material may be, for example, a group III element, and the second material may be, for example, a group V element. The group III element may be, for example, at least one of Ga, In, and Al. The group V element may be, for example, at least one of P, As, and Sb. Therefore, the fin F1 may be made of, for example, at least one of GaAs, InGaAs, AlGaAs, InAs, GaSb, InSb, and InP.

While an embodiment in which the substrate 101 is made of a different material from the fin F1, the present inventive concepts are not limited to this embodiment. Like the fin F1, the substrate 101 may also include the first material and the second material.

Figure 37:
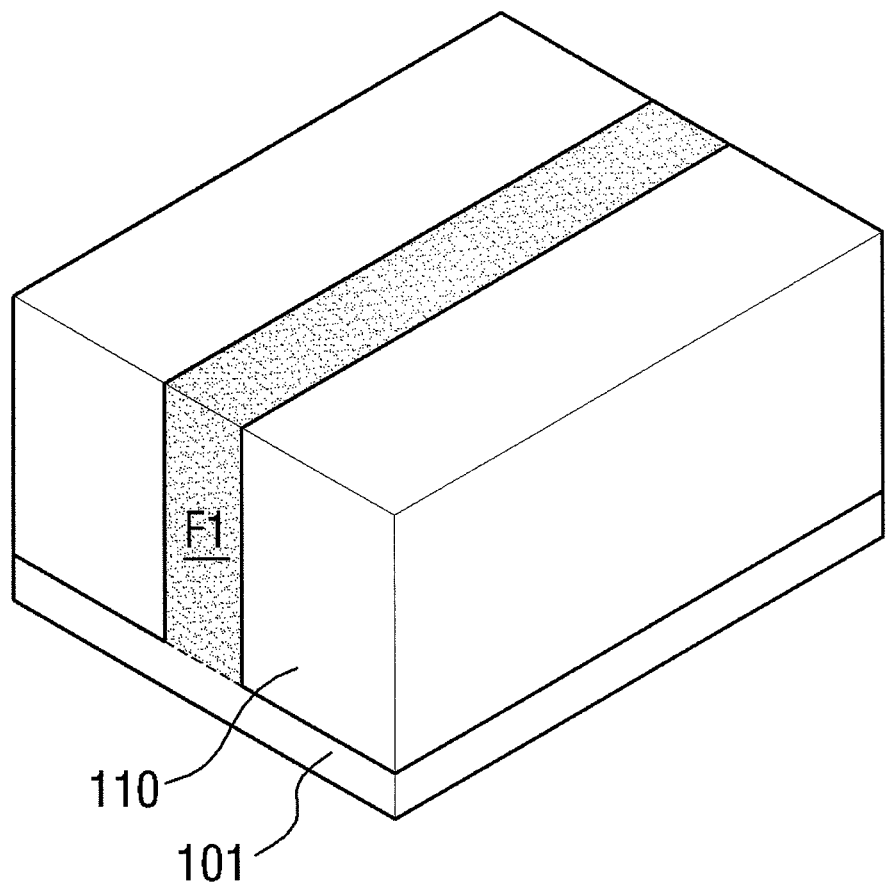

Referring to FIG. 37, a field insulating layer 110 may be formed on the substrate 101 to cover sidewalls of the fin F1 and top exposed surfaces of the substrate 101. The field insulating layer 110 may be made of a material including, for example, at least one of a silicon oxide layer, a silicon nitride layer, and a silicon oxynitride layer.

Figure 38:
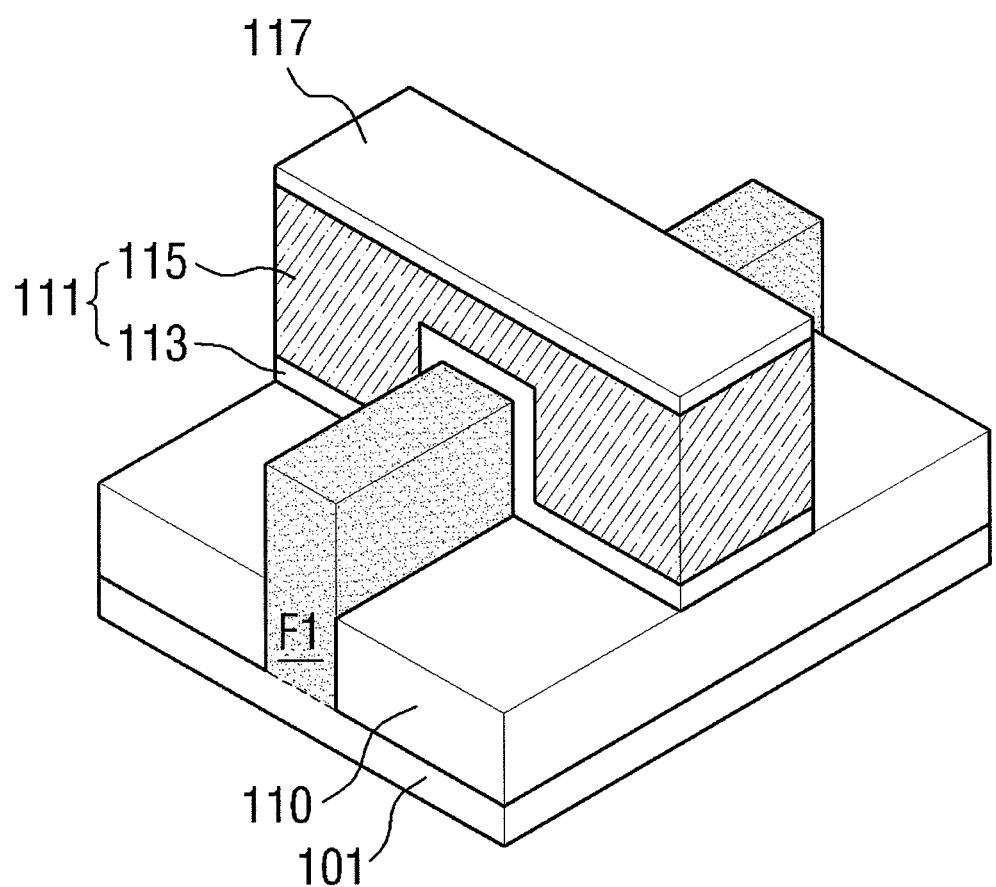

Referring to FIG. 38, an upper portion of the fin F1 may be exposed by recessing an upper portion of the field insulating layer 110. The recess process may include, for example, a selective etching process.

In an alternative embodiment, the upper portion of the fin F1 which protrudes upward from the field insulating layer 110 may also be formed by an epitaxial process. For example, after the formation of the field insulating layer 110, an epitaxial process may be performed using a top surface of the fin F1 exposed by the field insulating layer 110 as a seed, thereby forming the protruding portion of the fin F1 without a recess process.

Next, a dummy gate structure 111 is formed on the fin F1 to intersect the fin F1. In FIG. 38, the dummy gate structure 111 intersects the fin F1 at a right angle to the fin F1, that is, in the first direction X1. However, the present inventive concepts are not limited thereto. For example, the dummy gate structure 111 may also intersect the fin F1 at an acute angle and/or an obtuse angle to the first direction X1.

The dummy gate structure 111 may include a dummy gate insulating layer 113 and a dummy gate electrode 115. The dummy gate insulating layer 113 and the dummy gate electrode 115 may be stacked sequentially.

The dummy gate insulating layer 113 may be formed conformally along exposed upper portions of the sidewalls of the fin F1 not covered by field insulating layer 110 and the top surface of the fin F1. In addition, the dummy gate insulating layer 113 may be disposed between the dummy gate electrode 115 and the field insulating layer 110.

The dummy gate electrode 115 may be formed on the dummy gate insulating layer 113.

For example, the dummy gate electrode 115 may include, for example, polysilicon, and the dummy gate insulating layer 113 may include, for example, a silicon oxide layer.

A dummy hard mask layer 117 may be formed on the dummy gate structure 111. The dummy hard mask layer 117 may include, for example, at least one of silicon oxide, silicon nitride, and silicon oxynitride.

Figure 39:
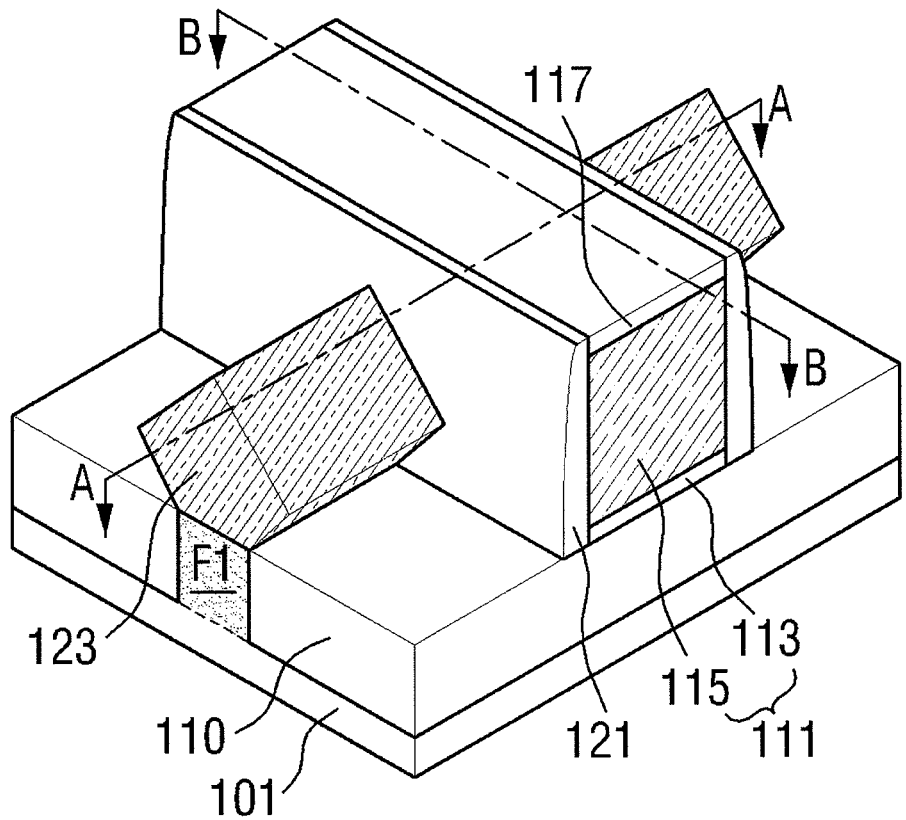
Figure 40:
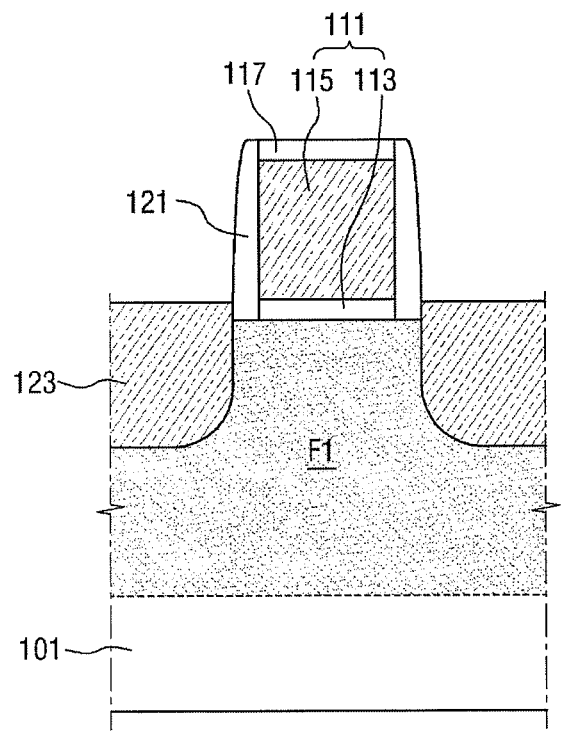
FIGS. 40, 42, 43, 45, 47, 49, 51 and 53 are cross-sectional views taken along the line A-A of FIG. 39.
Figure 41:
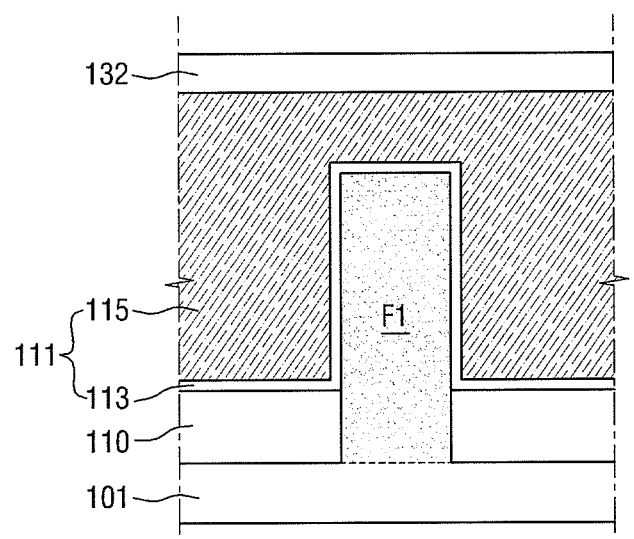
FIGS. 41, 44, 46, 48, 50, 52 and 54 are cross-sectional views taken along the line B-B of FIG. 39.

Referring to FIGS. 39 through 41, spacers 121 are formed on one or more sidewalls of the dummy gate structure 111. The spacers 121 may expose a top surface of the hard mask layer 117. The spacers 121 may include, for example, silicon nitride or silicon oxynitride.

Next, the protruding portion of the fin F1 not covered by the dummy gate structure 111 may be etched. The fin F1 may be etched using the spacers 121 and the dummy gate structure 111 as an etch mask.

Then, source/drain regions 123 may be formed in the etched portion of the fin F1. The source/drain regions 123 may be elevated source/drain regions. Therefore, top surfaces of the source/drain regions 123 may be higher than the top surface of the fin F1 as illustrated in FIG. 40.

To form an NMOS transistor, the source/drain regions 123 may be made of the same material as the substrate 101 or a tensile stress material. For example, if the substrate 101 is Si, the source/drain regions 123 may be made of a material having a smaller lattice constant than the material of the fin F1.

In an alternative embodiment, to form a PMOS transistor, the source/drain regions 123 may include a material, for example, a compressive stress material, having a greater lattice constant than the material of the fin F1. The compressive stress material may improve the mobility of carriers in a channel region by applying compressive stress to the fin F1, that is, the channel region, under the dummy gate structure 111.

The source/drain regions 123 may be formed by epitaxial growth.

In FIG. 39, the source/drain regions 123 are pentagonal. However, the present inventive concepts are not limited thereto. For example, the source/drain regions 123 may also be quadrilateral, circular, hexagonal, or the like.

A portion of the fin F1 which is covered by the dummy gate structure 111 and intersects the dummy gate structure 111 may be the channel region. The channel region of the fin F1 may be disposed between the source/drain regions 123.

Figure 42:
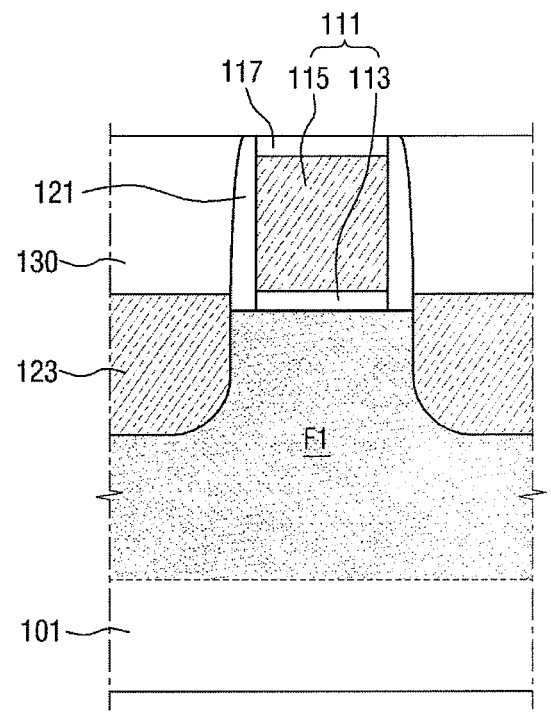

Referring to FIG. 42, a first interlayer insulating film 130 may be formed to cover the source/drain regions 123. The first interlayer insulating film 130 may cover sidewalls of the spacers 121 and expose the top surface of the spacers 121 and the hard mask layer 117. The first interlayer insulating film 130 may include, for example, silicon oxide.

Figure 43:
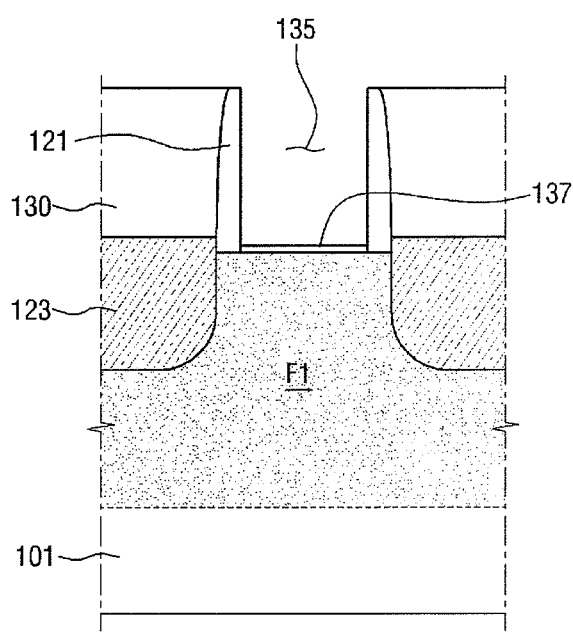
Figure 44:
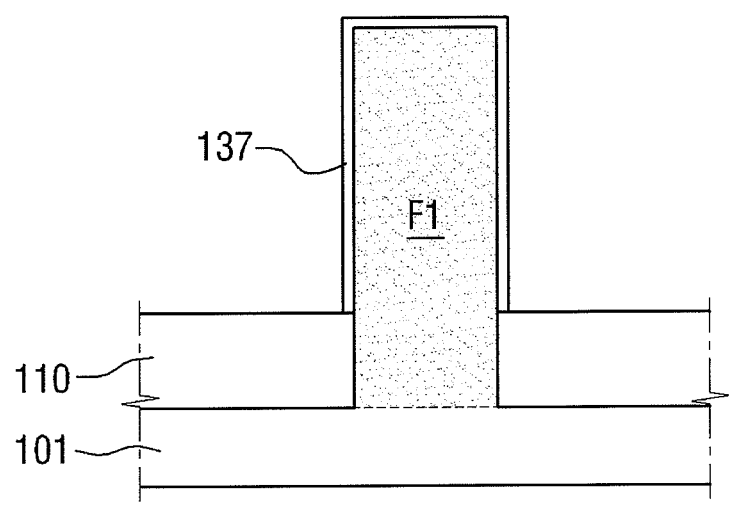

Referring to FIGS. 43 and 44, a trench 135 may be formed to expose the channel region of the fin F1. In forming the trench 135, first, the hard mask layer 117 may be removed. The hard mask layer 117 may be removed by a planarization process. The planarization process may also partially etch the first interlayer insulating film 130.

Then, the dummy gate structure 111 may be removed. Specifically, the dummy gate electrode 115 and the dummy gate insulating layer 113 may be removed to expose the fin F1. The trench 135 is formed where the dummy gate structure 111 used to exist. The inner sidewalls of the spacers 121 may be exposed by the trench 135. The trench 135 exposes the upper portion of the fin F1, that is, the channel region.

A natural oxide layer 137 may be formed on the upper portion of the fin F1 exposed by the trench 135. The natural oxide layer 137 may be formed by the reaction of the upper portion of the fin F1 with oxygen.

Figure 45:
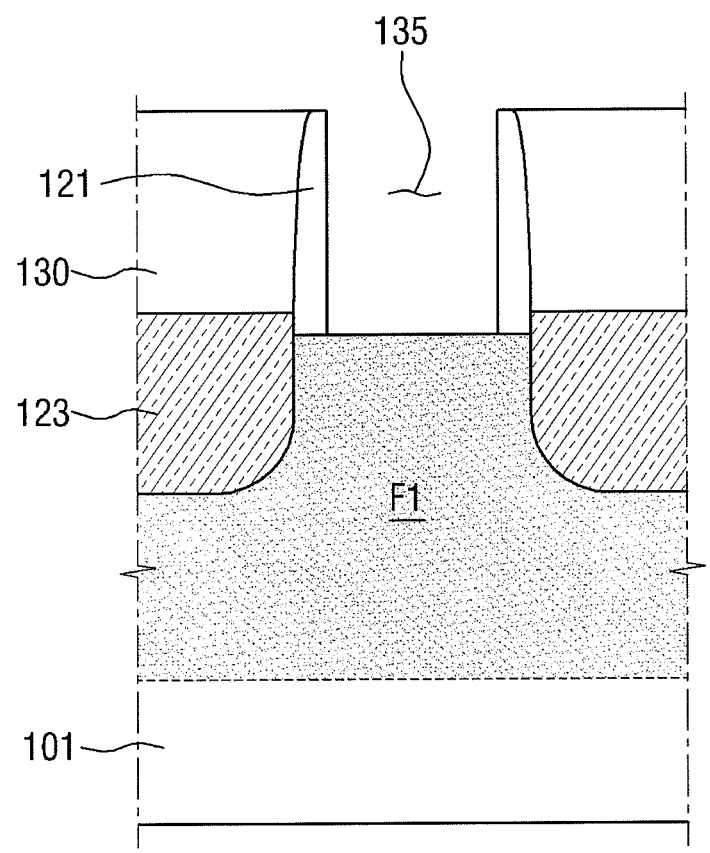
Figure 46:
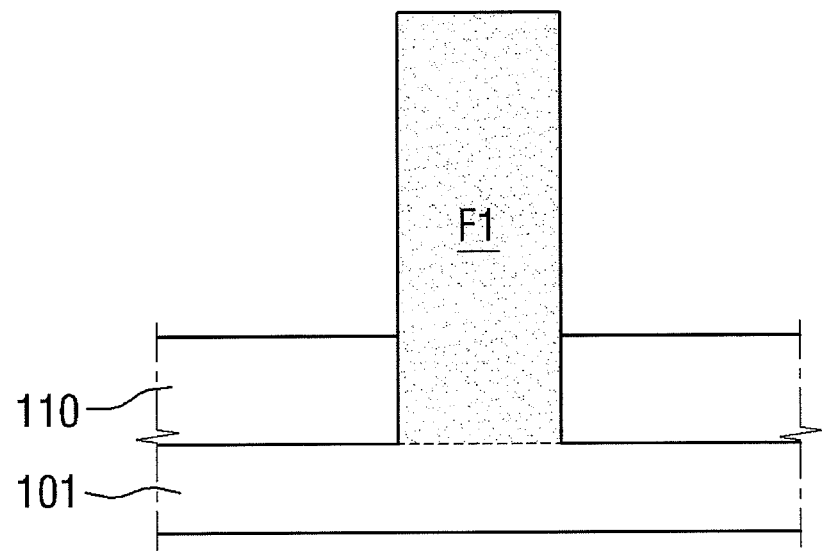

Referring to FIGS. 45 and 46, the natural oxide layer 137 may be removed by a cleaning process.

Figure 47:
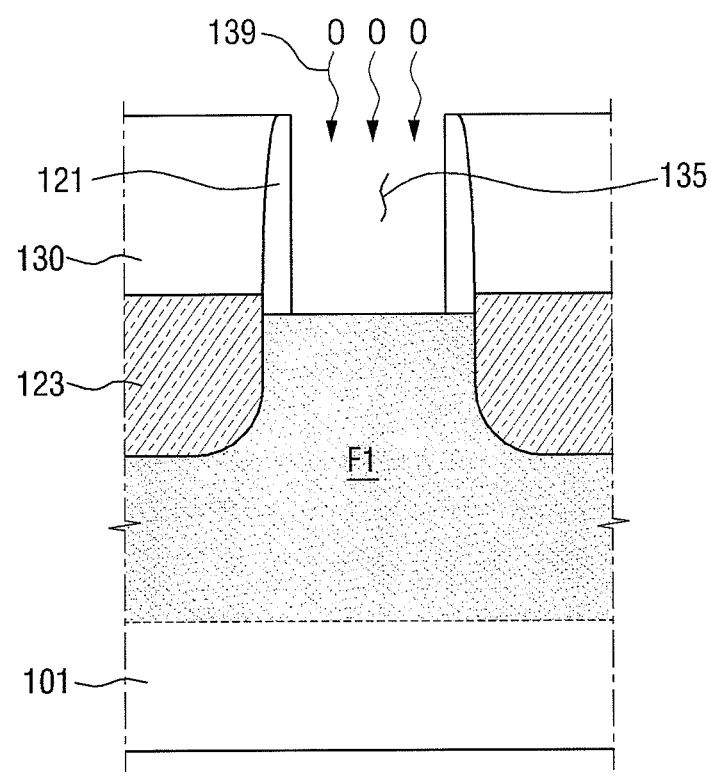
Figure 48:
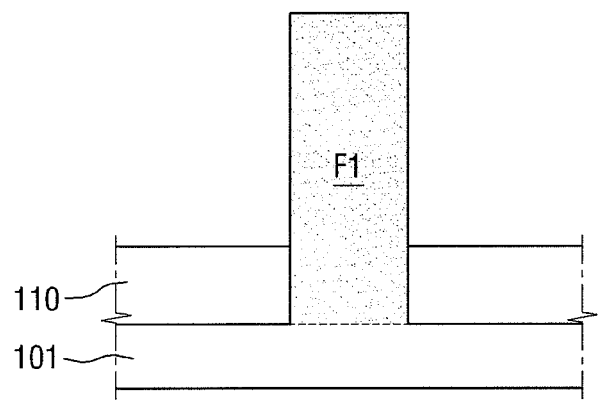

Referring to FIGS. 47 and 48, a surface of the exposed upper portion of the fin F1, that is, a surface of the channel region, may be oxidized by an oxidation process 139. The oxidation process 139 may be performed for 30 minutes to 2 hours at 5 atm or higher and at 300° C. or higher. Alternatively, the oxidation process 139 may be performed for 30 minutes to 2 hours at a high temperature of 600° C. or higher.

Figure 49:
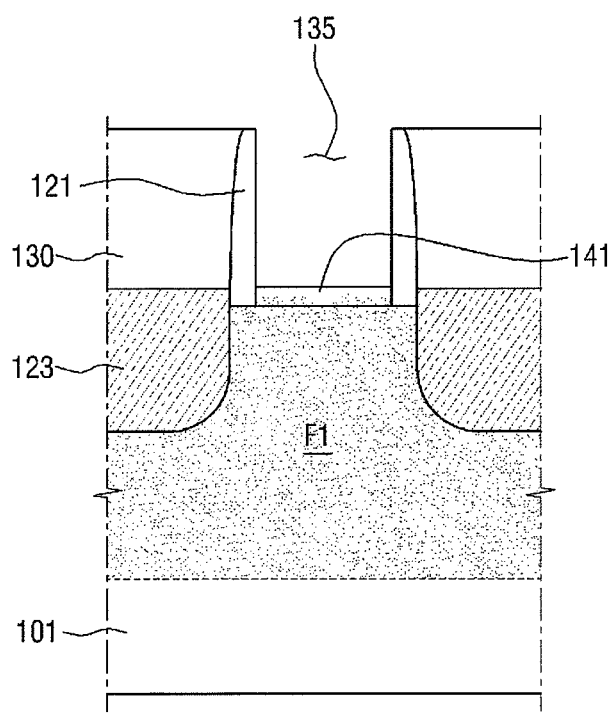
Figure 50:
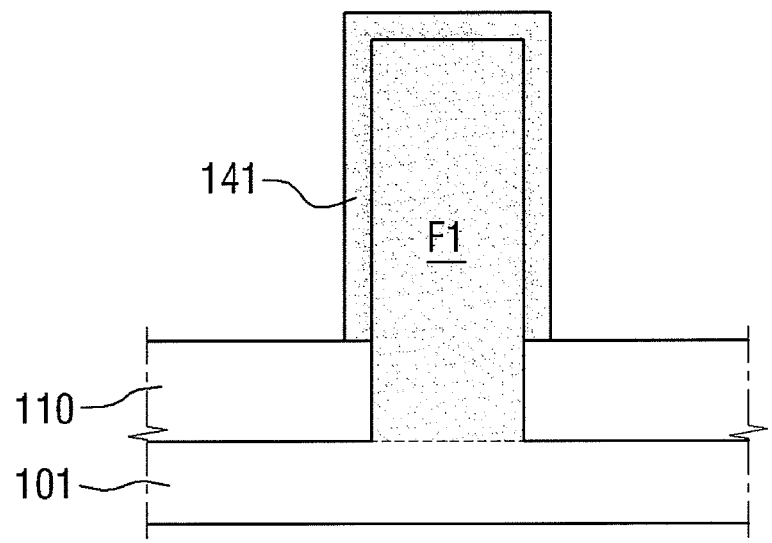

Referring to FIGS. 49 and 50, the oxidation process 139 may form an oxide layer 141 on the surface of the upper portion of the fin F1. The oxide layer 141 may be formed by the reaction of oxygen with the first and second materials included in the fin F1. In the oxidation process 139 which is performed under the above conditions, the first material in the fin F1 may bond with more oxygen atoms than the second material in the fin F1. Therefore, the oxide layer 141 may include more oxides of the first material.

Figure 51:
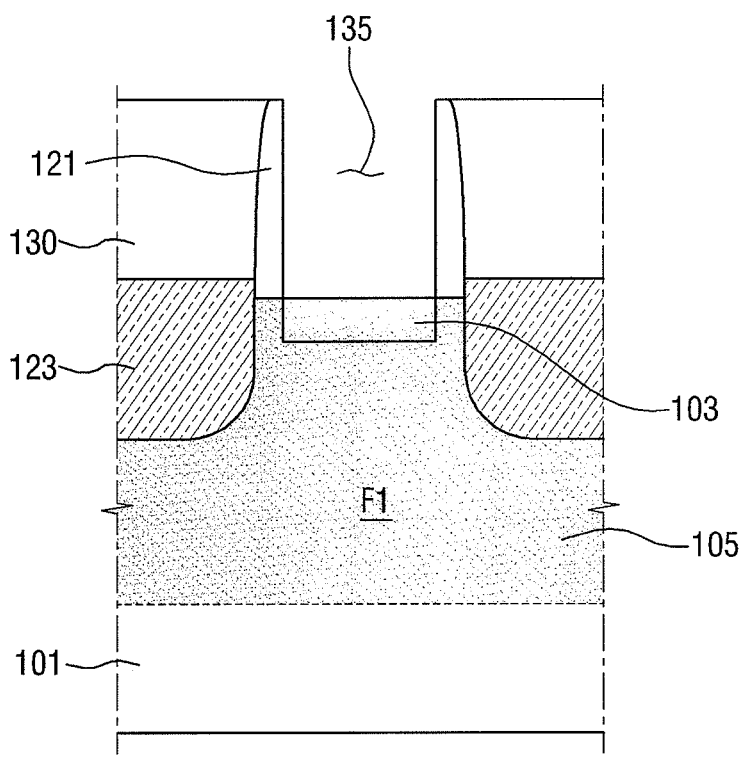
Figure 52:
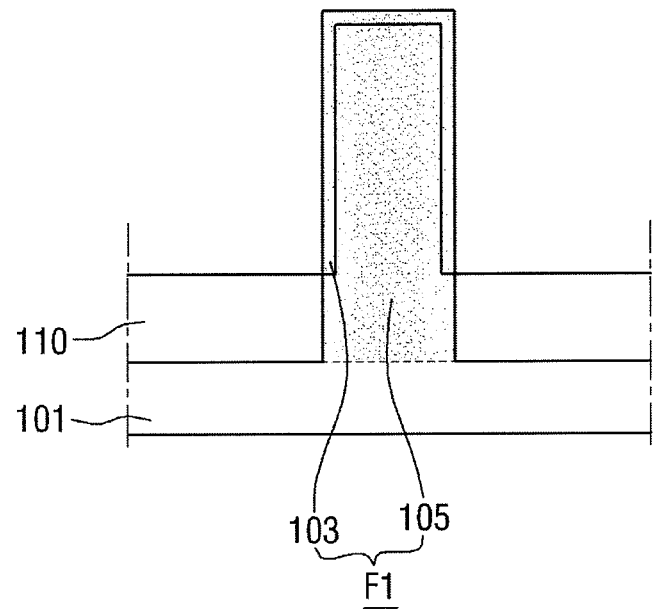

Referring to FIGS. 51 and 52, the oxide layer 141 may be removed. To remove the oxide layer 141, a wet etching process may be performed using, for example, HF, NH4OH, HCl, or the like, as an etchant.

The removal of the oxide layer 141 may change the concentration of the first material and the concentration of the second material in the channel region of the fin F1. The concentration of the first material may in the channel region of the fin F1 gradually increase from the surface of the channel region of the fin F1 toward the inside, or an interior, of the channel region.

Specifically, the channel region of the fin F1 may include a first region 103 and a second region 105. The first region 103 may be located at the surface of the channel region of the fin F1, and the second region 150 may be disposed under the first region 103. The first region 103 may contact a gate structure 151 which will be formed later, as illustrated in FIG. 55. The first region 103 may be disposed in a top surface and sidewalls of the fin F1. The first region 103 may have a thickness of, for example, 1 to 20 nm.

In the first region 103, the concentration of the first material increases gradually from a surface of the first region 103 toward a surface of the first region 103 that contacts the second region 105. That is, the concentration of the first material at the top surface of the first region 103 is less than the concentration of the first material at the surface of the first region 103 which contacts the second region 105. The concentration of the first material at a top surface of the first region 103 is 10% or less. In the first region 103, the concentration of the first material is lower than that of the second material.

In the first region 103, the concentration of the second material is higher than that of the first material. That is, the concentration of the second material is higher than the first material at the top surface of the first region 103 and at the surface of the first region 103 which contacts the second region 105. However, the concentration of the second material decreases toward a bottom surface of the first region 103, and a difference between the concentration of the second material and the concentration of the first material is reduced toward the bottom surface of the first region 103.

The first region 103 may include oxygen atoms which have not been removed by the wet etching process. The oxygen atoms may be reduced from the top surface of the first region 103 toward the bottom surface of the first region 103 and may no longer exist at a specific depth from the top surface of the first region 103. That is, the oxygen atoms at the top surface of the first region 103 are greater than the oxygen atoms at the bottom surface of the first region 103. The concentration of oxygen atoms may be 5% or less at the top surface of the first region 103.

In the second region 105, the concentration of the first material may be substantially equal to that of the second material. Here, the term "substantially" denotes not only exactly the same, but also permits for a margin of error that may occur during a process. Therefore, the concentration of the first material and the concentration of the second material may not be equal in some parts of the second region 105.

In the second region 105, the oxygen atoms may hardly exist.

Each of the source/drain regions 123 and the first region 103 may be separated by a width of each of the spacers 121. Therefore, the concentration of the first material may be substantially equal to that of the second material at the surface of the fin F1 which contacts the source/drain regions 123. That is, the concentration of the first material and the concentration of the second material may be substantially equal at a surface of the second region 105 which contacts the source/drain regions 123.

Figure 53:
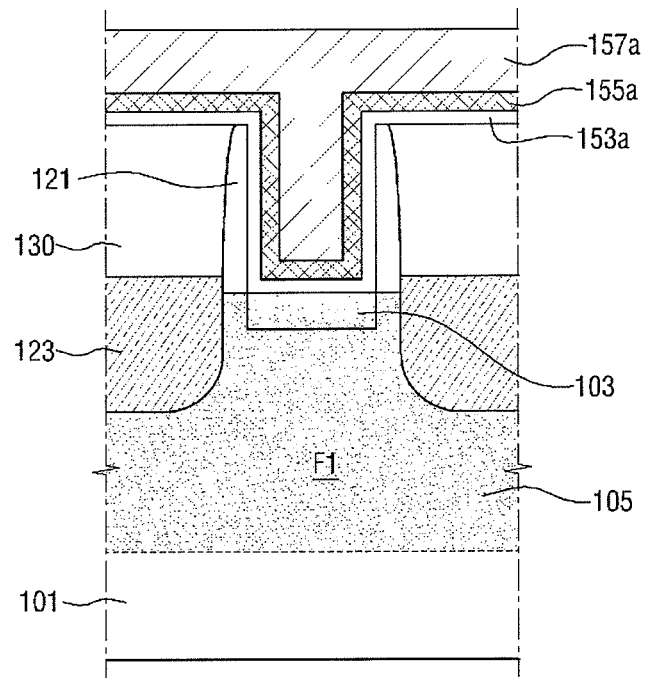
Figure 54:
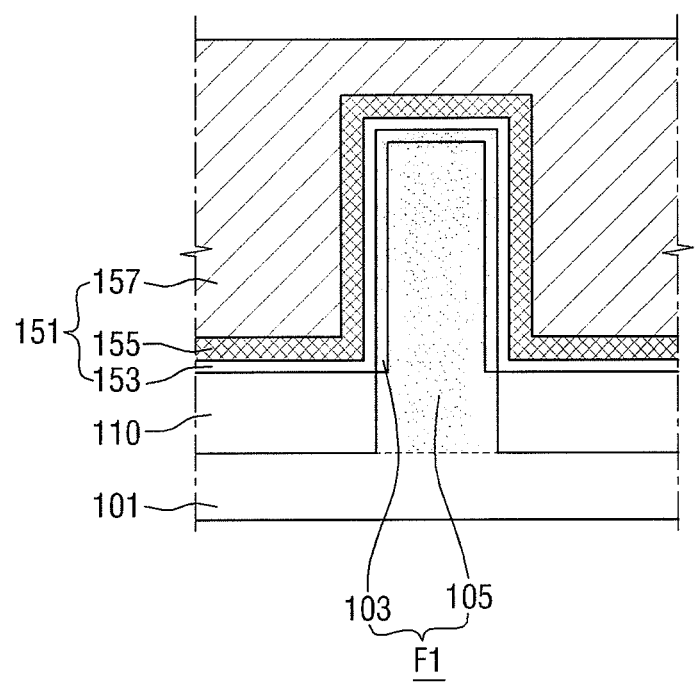

Referring to FIGS. 53 and 54, a gate insulating layer 153a and a first metal layer 155a and a second metal layer 157a that form a gate electrode may be formed sequentially in the trench 135.

The gate insulating layer 153a may be formed conformally along sidewalls and a bottom surface of the trench 135. In addition, the gate insulating layer 153a may be formed conformally along the field insulating layer 110, the upper portions of the sidewalls of the fin F1, and the top surface of the fin F1. The gate insulating layer 153a may also be formed on the first interlayer insulating film 130 and top surfaces of the spacers 121. The gate insulating layer 153a may contact the first region 103.

The gate insulating layer 153a may include, for example, a silicon oxide layer or a high-k material having a higher dielectric constant than the silicon oxide layer. The gate insulating layer 153a may include, for example, a material selected from the group consisting of HfSiON, $HfO_2$, $ZrO_2$, $Al_2O_3$, $Ta_2O_5$, $TiO_2$, $SrTiO_3$, and $(Ba,Sr)TiO_3$. The gate insulating layer 153a may be formed to an appropriate thickness according to the type of device to be formed.

The first metal layer 155a may be formed on the gate insulating layer 153a. The first metal layer 155a may be formed conformally along the sidewalls and bottom surface of the trench 135. In addition, the first metal layer 155a may be formed conformally along the field insulating layer 110, the upper portions of the sidewalls of the fin F1, and the top surface of the fin F1. The first metal layer 155a may also be formed on the first interlayer insulating film 130 and the top surfaces of the spacers 121. The first metal layer 155a adjusts the work function of a transistor.

For example, if the first metal layer 155a is a P-type work function control layer, it may include, for example, TiN. If the first metal layer 155a is an N-type work function control layer, it may include, for example, at least one of TiAl, TiAlC, TiAlN, TaC, TiC, and HfSi.

In the drawings, the first metal layer 155a is illustrated as a single layer. However, the present inventive concepts are not limited thereto. For example, the first metal layer 155a may also be a multilayer composed of a P-type work function control layer and an N-type work function control layer disposed on the P-type work function control layer.

The second metal layer 157a may be formed on the first metal layer 155a. The second metal layer 157a may fill the remaining portion of the trench 135. The second metal layer 157a may also be formed on the first interlayer insulating film 130 and the top surfaces of spacers 121. In addition, the first metal layer 155a may be formed along the field insulating layer 110, the upper portions of the sidewalls of the fin F1, and the top surface of the fin F1.

The second metal layer 157a may include, for example, Al, W, or the like.

Referring to FIGS. 55 through 57, the gate structure 151 may be formed. Specifically, a planarization process may be performed on the resultant structure of FIGS. 53 and 54 to expose the first interlayer insulating film 130. As a result, the gate structure 151 including a gate insulating layer 153, a first metal layer 155 and a second metal layer 157 may be formed.

The gate insulating layer 153 and the first metal layer 155 within the trench 135 may be concave in shape.

Referring to FIGS. 56 and 57, a second interlayer insulating film 132 may be formed on the first interlayer insulating film 130. The second interlayer insulating film 132 may cover the gate structure 151.

The second interlayer insulating film 132 may include the same material as the first interlayer insulating film 130 and may include, for example, at least one of an oxide layer and an oxynitride layer.

Contact metal layers 191 are formed on top surfaces of the source/drain regions 123, and contacts 193 are formed to penetrate through the first and second interlayer insulating films 130 and 132, thereby completing the semiconductor device 6 of FIGS. 6 through 8.

The contact metal layers 191 may reduce the surface resistance, contact resistance, or the like, of the source/drain regions 123 and may include, for example, Pt, Ni, Co, Au, Al, etc.

The contacts 193 may include, e.g., W, Al, Cu, or the like.

Although preferred embodiments of the present inventive concepts have been described for illustrative purposes, those skilled in the art will appreciate that various modifications, additions and substitutions are possible, without departing from the scope and spirit of the inventive concepts as disclosed in the accompanying claims.

What is claimed is:

1. A semiconductor device comprising:
a semiconductor substrate comprising a group III element and a group V element; and
a gate structure on the semiconductor substrate,
wherein the semiconductor substrate comprises:
a first region directly contacting a bottom surface of the gate structure; and
a second region disposed under the first region,
wherein the concentration of the group III element in the first region is lower than that of the group V element in the first region, and the concentration of the group III element in the second region is substantially equal to that of the group V element in the second region.

2. The semiconductor device of claim 1, wherein the group III element is at least one of Ga, In and Al, and the group V element is at least one of P, As and Sb.

3. The semiconductor device of claim 1, wherein the concentration of the group III element in the first region increases from a top surface of the first region toward a bottom surface of the first region.

4. The semiconductor device of claim 1, wherein the top surface of the first region comprises 5% or less of oxygen atoms.

5. The semiconductor device of claim 1, wherein the first region has a thickness of 1 to 20 nm.

6. The semiconductor device of claim 1, wherein the gate structure comprises a gate insulating layer contacting the first region and a gate electrode disposed on the gate insulating layer.

7. The semiconductor device of claim 1, further comprising source/drain regions disposed in the semiconductor substrate on one or more sides of the first and second regions.

8. The semiconductor device of claim 1, further comprising a substrate disposed under the semiconductor substrate.

9. A semiconductor device comprising:
a semiconductor substrate comprising a group III element and a group V element; and
a gate structure on the semiconductor substrate,
wherein the semiconductor substrate comprises:
a first region directly contacting a bottom surface of the gate structure; and
a second region disposed under the first region,
wherein the concentration of the group V element is higher than the concentration of the group III element at the surface of the semiconductor substrate, and
wherein the concentration of the group III element in the second region is substantially equal to that of the group V element in the second region.

10. The semiconductor device of claim 9, wherein the concentration of the group III element in the first region increases from a top surface of the first region toward a bottom surface of the first region.

11. The semiconductor device of claim 9, wherein the concentration of the group III element in the first region is lower than that of the group V element in the first region.

12. The semiconductor device of claim 9, wherein the group III element is at least one of Ga, In and Al, and the group V element is at least one of P, As and Sb.

13. The semiconductor device of claim 9, further comprising spacers disposed on one or more sides of the gate structure, the first region contacting a bottom surface of the spacers.

14. A semiconductor device comprising:
a semiconductor substrate comprising a group V element and at least one of group III elements; and
a gate structure on the semiconductor substrate, wherein the semiconductor substrate comprises:
a first region contacting a bottom surface of the gate structure; and a second region disposed under the first region, wherein a total concentration of the group III elements in the first region is lower than that of a total concentration of the group V element in the first region.

15. The semiconductor device of claim 14, wherein the concentration of the group V element is higher than the total concentration of the group III elements at the surface of the semiconductor substrate.

16. The semiconductor device of claim 14, further comprising spacers disposed on one or more sides of the gate structure, the first region contacting a bottom surface of the spacers.

17. The semiconductor device of claim 14, wherein the first region directly contacts the bottom surface of the gate structure.

18. The semiconductor device of claim 14, wherein the group III elements is at least one of Ga, In and Al, and the group V element is at least one of P, As and Sb.

* * * * *